(12) United States Patent
Shanmugasundram et al.

(10) Patent No.: US 8,005,634 B2
(45) Date of Patent: Aug. 23, 2011

(54) COPPER WIRING MODULE CONTROL

(75) Inventors: Arulkumar Shanmugasundram, Mountain View, CA (US); Suketu A. Parikh, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1020 days.

(21) Appl. No.: 11/627,353

(22) Filed: Jan. 25, 2007

(65) Prior Publication Data

US 2007/0122921 A1    May 31, 2007

Related U.S. Application Data

(62) Division of application No. 10/393,531, filed on Mar. 21, 2003, now abandoned.

(60) Provisional application No. 60/366,270, filed on Mar. 22, 2002.

(51) Int. Cl.
*G01N 37/00* (2006.01)

(52) U.S. Cl. ......................................... 702/81

(58) Field of Classification Search .................. None
See application file for complete search history.

(56) References Cited

U.S. PATENT DOCUMENTS

| | | |
|---|---|---|
| 3,205,485 A | 9/1965 | Noltingk |
| 3,229,198 A | 1/1966 | Libby |
| 3,767,900 A | 10/1973 | Chao et al. |
| 3,920,965 A | 11/1975 | Sohrwardy |
| 4,000,458 A | 12/1976 | Miller et al. |
| 4,302,721 A | 11/1981 | Urbanek et al. |
| 4,368,510 A | 1/1983 | Anderson |
| 4,616,308 A | 10/1986 | Morshedi et al. |
| 4,663,703 A | 5/1987 | Axelby et al. |
| 4,698,766 A | 10/1987 | Entwistle et al. |
| 4,750,141 A | 6/1988 | Judell et al. |
| 4,757,259 A | 7/1988 | Charpentier |
| 4,796,194 A | 1/1989 | Atherton |
| 4,938,600 A | 7/1990 | Into |

(Continued)

FOREIGN PATENT DOCUMENTS

CA    2050247    8/1991

(Continued)

OTHER PUBLICATIONS

Applied Materials, Inc. 2002. "Applied Materials: Information for Everyone: Copper Electrochemical Plating." www.appliedmaterials.com/products/copper_electrochemical_plating.html.

(Continued)

*Primary Examiner* — Charles D Garber
*Assistant Examiner* — Andre' C Stevenson
(74) *Attorney, Agent, or Firm* — Fish & Richardson P.C.

(57) ABSTRACT

Techniques for controlling an output property during wafer processing include forwarding feedforward and feedback information between functional units in a wafer manufacturing facility. At least some embodiments of the invention envision implementing such techniques in a copper wiring module to optimize a sheet resistance or an interconnect line resistance. Initially, a first wafer property is measured during or after processing by a plating process. Subsequently, the wafer is forwarded to a polishing process. A second wafer property is then measured during or after processing by the second process. At least one of these first and second wafer properties are used to optimize the second process. Specifically, one or more target parameters of a second process recipe are adjusted in a manner that obtains a desired final output property on the wafer by using these first and second wafer properties.

32 Claims, 8 Drawing Sheets

U.S. PATENT DOCUMENTS

| | | |
|---|---|---|
| 4,967,381 A | 10/1990 | Lane et al. |
| 5,036,015 A | 7/1991 | Sandhu et al. |
| 5,069,002 A | 12/1991 | Sandhu et al. |
| 5,081,796 A | 1/1992 | Schultz |
| 5,089,970 A | 2/1992 | Lee et al. |
| 5,108,570 A | 4/1992 | Wang |
| 5,208,765 A | 5/1993 | Turnbull |
| 5,220,517 A | 6/1993 | Sierk et al. |
| 5,222,329 A | 6/1993 | Yu |
| 5,226,118 A | 7/1993 | Baker et al. |
| 5,231,585 A | 7/1993 | Kobayashi et al. |
| 5,236,868 A | 8/1993 | Nulman |
| 5,240,552 A | 8/1993 | Yu et al. |
| 5,260,868 A | 11/1993 | Gupta et al. |
| 5,270,222 A | 12/1993 | Moslehi |
| 5,283,141 A | 2/1994 | Yoon et al. |
| 5,295,242 A | 3/1994 | Mashruwala et al. |
| 5,309,221 A | 5/1994 | Fischer et al. |
| 5,329,463 A | 7/1994 | Sierk et al. |
| 5,338,630 A | 8/1994 | Yoon et al. |
| 5,347,446 A | 9/1994 | Iino et al. |
| 5,367,624 A | 11/1994 | Cooper |
| 5,375,064 A | 12/1994 | Bollinger |
| 5,398,336 A | 3/1995 | Tantry et al. |
| 5,402,367 A | 3/1995 | Sullivan et al. |
| 5,408,405 A | 4/1995 | Mozumder et al. |
| 5,410,473 A | 4/1995 | Kaneko et al. |
| 5,413,941 A | 5/1995 | Koos et al. |
| 5,420,796 A | 5/1995 | Weling et al. |
| 5,439,551 A | 8/1995 | Meikle et al. |
| 5,469,361 A | 11/1995 | Moyne |
| 5,485,082 A | 1/1996 | Wisspeintner et al. |
| 5,486,129 A | 1/1996 | Sandhu et al. |
| 5,490,097 A | 2/1996 | Swenson et al. |
| 5,495,417 A | 2/1996 | Fuduka et al. |
| 5,497,316 A | 3/1996 | Sierk et al. |
| 5,497,381 A | 3/1996 | O'Donoghue et al. |
| 5,503,707 A | 4/1996 | Maung et al. |
| 5,508,947 A | 4/1996 | Sierk et al. |
| 5,511,005 A | 4/1996 | Abbe et al. |
| 5,519,605 A | 5/1996 | Cawlfield |
| 5,525,808 A | 6/1996 | Irie et al. |
| 5,526,293 A | 6/1996 | Mozumder et al. |
| 5,541,510 A | 7/1996 | Danielson |
| 5,546,312 A | 8/1996 | Mozumder et al. |
| 5,553,195 A | 9/1996 | Meijer |
| 5,586,039 A | 12/1996 | Hirsch et al. |
| 5,599,423 A | 2/1997 | Parker et al. |
| 5,602,492 A | 2/1997 | Cresswell et al. |
| 5,603,707 A | 2/1997 | Trombetta et al. |
| 5,617,023 A | 4/1997 | Skalski |
| 5,618,447 A | 4/1997 | Sandhu |
| 5,627,083 A | 5/1997 | Tounai |
| 5,629,216 A | 5/1997 | Wijaranakula et al. |
| 5,642,296 A | 6/1997 | Saxena |
| 5,643,048 A | 7/1997 | Iyer |
| 5,643,060 A | 7/1997 | Sandhu et al. |
| 5,646,870 A | 7/1997 | Krivokapic et al. |
| 5,649,169 A | 7/1997 | Berezin et al. |
| 5,654,903 A | 8/1997 | Reitman et al. |
| 5,655,951 A | 8/1997 | Meikle et al. |
| 5,657,254 A | 8/1997 | Sierk et al. |
| 5,658,183 A | 8/1997 | Sandhu et al. |
| 5,661,669 A | 8/1997 | Mozumder et al. |
| 5,663,797 A | 9/1997 | Sandhu |
| 5,664,987 A | 9/1997 | Renteln |
| 5,665,199 A | 9/1997 | Sahota et al. |
| 5,666,297 A | 9/1997 | Britt et al. |
| 5,667,424 A | 9/1997 | Pan |
| 5,674,787 A | 10/1997 | Zhao et al. |
| 5,694,325 A | 12/1997 | Fukuda et al. |
| 5,698,989 A | 12/1997 | Nulman |
| 5,700,180 A | 12/1997 | Sandhu et al. |
| 5,719,495 A | 2/1998 | Moslehi |
| 5,719,796 A | 2/1998 | Chen |
| 5,730,642 A | 3/1998 | Sandhu et al. |
| 5,735,055 A | 4/1998 | Hochbein et al. |
| 5,738,562 A | 4/1998 | Doan et al. |
| 5,738,574 A | 4/1998 | Tolles et al. |
| 5,740,429 A | 4/1998 | Wang et al. |
| 5,751,582 A | 5/1998 | Saxena et al. |
| 5,754,297 A | 5/1998 | Nulman |
| 5,761,064 A | 6/1998 | La et al. |
| 5,762,537 A | 6/1998 | Sandhu et al. |
| 5,764,543 A | 6/1998 | Kennedy |
| 5,777,739 A | 7/1998 | Sandhu et al. |
| 5,777,901 A | 7/1998 | Berezin et al. |
| 5,787,021 A | 7/1998 | Samaha |
| 5,787,269 A | 7/1998 | Hyodo |
| 5,808,303 A | 9/1998 | Schlagheck et al. |
| 5,812,407 A | 9/1998 | Sato et al. |
| 5,823,854 A | 10/1998 | Chen |
| 5,825,913 A | 10/1998 | Rostami et al. |
| 5,828,778 A | 10/1998 | Hagi et al. |
| 5,832,224 A | 11/1998 | Fehskens et al. |
| 5,838,595 A | 11/1998 | Sullivan et al. |
| 5,840,614 A | 11/1998 | Sim et al. |
| 5,842,909 A | 12/1998 | Sandhu et al. |
| 5,844,554 A | 12/1998 | Geller et al. |
| 5,851,135 A | 12/1998 | Sandhu et al. |
| 5,855,804 A | 1/1999 | Walker |
| 5,857,258 A | 1/1999 | Penzes et al. |
| 5,859,964 A | 1/1999 | Wang et al. |
| 5,859,975 A | 1/1999 | Brewer et al. |
| 5,863,807 A | 1/1999 | Jang et al. |
| 5,870,306 A | 2/1999 | Harada |
| 5,883,437 A | 3/1999 | Maruyama et al. |
| 5,889,991 A | 3/1999 | Consolatti et al. |
| 5,901,313 A | 5/1999 | Wolf et al. |
| 5,903,455 A | 5/1999 | Sharpet, Jr. et al. |
| 5,910,011 A | 6/1999 | Cruse |
| 5,910,846 A | 6/1999 | Sandhu |
| 5,916,016 A | 6/1999 | Bothra |
| 5,923,553 A | 7/1999 | Yi |
| 5,930,138 A | 7/1999 | Lin et al. |
| 5,936,733 A | 8/1999 | Sandhu et al. |
| 5,940,300 A | 8/1999 | Ozaki |
| 5,943,237 A | 8/1999 | Van Boxem |
| 5,960,185 A | 9/1999 | Nguyen |
| 5,960,214 A | 9/1999 | Sharpe, Jr. et al. |
| 5,961,369 A | 10/1999 | Bartels et al. |
| 5,963,881 A | 10/1999 | Kahn et al. |
| 5,978,751 A | 11/1999 | Pence et al. |
| 5,982,920 A | 11/1999 | Tobin, Jr. et al. |
| 5,985,094 A | 11/1999 | Mosca |
| 5,997,384 A | 12/1999 | Blalock |
| 6,002,989 A | 12/1999 | Shiba et al. |
| 6,007,408 A | 12/1999 | Sandhu |
| 6,017,771 A | 1/2000 | Yang et al. |
| 6,036,349 A | 3/2000 | Gombar |
| 6,041,270 A | 3/2000 | Steffan et al. |
| 6,046,111 A | 4/2000 | Robinson |
| 6,054,379 A | 4/2000 | Yau et al. |
| 6,064,759 A | 5/2000 | Buckley et al. |
| 6,072,313 A | 6/2000 | Li et al. |
| 6,075,606 A | 6/2000 | Doan |
| 6,078,845 A | 6/2000 | Friedman |
| 6,094,688 A | 7/2000 | Mellen-Garnett et al. |
| 6,097,887 A | 8/2000 | Hardikar et al. |
| 6,108,092 A | 8/2000 | Sandhu |
| 6,112,130 A | 8/2000 | Fukuda et al. |
| 6,120,347 A | 9/2000 | Sandhu |
| 6,127,263 A | 10/2000 | Parikh |
| 6,128,016 A | 10/2000 | Coelho et al. |
| 6,136,163 A | 10/2000 | Cheung et al. |
| 6,141,660 A | 10/2000 | Bach et al. |
| 6,143,646 A | 11/2000 | Wetzel |
| 6,148,099 A | 11/2000 | Lee et al. |
| 6,148,239 A | 11/2000 | Funk et al. |
| 6,148,246 A | 11/2000 | Kawazome |
| 6,157,078 A | 12/2000 | Lansford |
| 6,159,073 A | 12/2000 | Wiswesser et al. |
| 6,159,075 A | 12/2000 | Zhang |
| 6,159,644 A | 12/2000 | Satoh et al. |
| 6,161,054 A | 12/2000 | Rosenthal et al. |
| 6,169,931 B1 | 1/2001 | Runnels |
| 6,172,756 B1 | 1/2001 | Chalmers et al. |

| | | |
|---|---|---|
| 6,173,240 B1 | 1/2001 | Sepulveda et al. |
| 6,175,777 B1 | 1/2001 | Kim |
| 6,178,390 B1 | 1/2001 | Jun |
| 6,183,345 B1 | 2/2001 | Kamono et al. |
| 6,184,571 B1 | 2/2001 | Moore |
| 6,185,324 B1 | 2/2001 | Ishihara et al. |
| 6,190,494 B1 | 2/2001 | Dow |
| 6,191,864 B1 | 2/2001 | Sandhu |
| 6,192,291 B1 | 2/2001 | Kwon |
| 6,197,604 B1 | 3/2001 | Miller et al. |
| 6,204,165 B1 | 3/2001 | Ghoshal |
| 6,206,754 B1 | 3/2001 | Moore |
| 6,206,769 B1 | 3/2001 | Walker |
| 6,208,425 B1 | 3/2001 | Sandhu et al. |
| 6,210,983 B1 | 4/2001 | Atchison et al. |
| 6,211,094 B1 | 4/2001 | Jun et al. |
| 6,213,845 B1 | 4/2001 | Elledge |
| 6,214,734 B1 | 4/2001 | Bothra et al. |
| 6,217,412 B1 | 4/2001 | Campbell et al. |
| 6,219,711 B1 | 4/2001 | Chari |
| 6,222,936 B1 | 4/2001 | Phan et al. |
| 6,226,792 B1 | 5/2001 | Goiffon et al. |
| 6,230,069 B1 | 5/2001 | Cmapbell et al. |
| 6,234,878 B1 | 5/2001 | Moore |
| 6,236,903 B1 | 5/2001 | Kim et al. |
| 6,240,330 B1 | 5/2001 | Kurtzberg et al. |
| 6,240,331 B1 | 5/2001 | Yun |
| 6,246,972 B1 | 6/2001 | Klimasauskas |
| 6,248,602 B1 | 6/2001 | Bode et al. |
| 6,249,712 B1 | 6/2001 | Boiquaye |
| 6,252,412 B1 | 6/2001 | Talbot et al. |
| 6,253,366 B1 | 6/2001 | Mutschler, III |
| 6,261,151 B1 | 7/2001 | Sandhu et al. |
| 6,263,255 B1 | 7/2001 | Tan et al. |
| 6,276,989 B1 | 8/2001 | Campbell et al. |
| 6,278,899 B1 | 8/2001 | Piche et al. |
| 6,280,289 B1 | 8/2001 | Wiswesser et al. |
| 6,284,622 B1 | 9/2001 | Campbell et al. |
| 6,287,879 B1 | 9/2001 | Gonzales et al. |
| 6,290,572 B1 | 9/2001 | Hofmann |
| 6,291,253 B1 | 9/2001 | Landford et al. |
| 6,292,708 B1 | 9/2001 | Allen et al. |
| 6,298,274 B1 | 10/2001 | Inoue |
| 6,298,470 B1 | 10/2001 | Breiner et al. |
| 6,301,006 B1 | 10/2001 | Doan |
| 6,303,395 B1 | 10/2001 | Nulman |
| 6,304,999 B1 | 10/2001 | Toprac et al. |
| 6,306,009 B1 | 10/2001 | Sandhu et al. |
| 6,307,628 B1 | 10/2001 | Lu et al. |
| 6,314,379 B1 | 11/2001 | Hu et al. |
| 6,319,420 B1 | 11/2001 | Dow |
| 6,320,655 B1 | 11/2001 | Matsushita et al. |
| 6,323,046 B1 | 11/2001 | Agarwal |
| 6,324,481 B1 | 11/2001 | Atchison et al. |
| 6,334,807 B1 | 1/2002 | Lebel et al. |
| 6,336,841 B1 | 1/2002 | Chang |
| 6,338,667 B2 | 1/2002 | Sandhu et al. |
| 6,340,602 B1 | 1/2002 | Johnson et al. |
| 6,345,288 B1 | 2/2002 | Reed et al. |
| 6,345,315 B1 | 2/2002 | Mishra |
| 6,350,179 B2 | 2/2002 | Campbell et al. |
| 6,360,133 B1 | 3/2002 | Campbell et al. |
| 6,360,184 B1 | 3/2002 | Jacquez |
| 6,362,105 B1 | 3/2002 | Moore |
| 6,364,742 B1 | 4/2002 | Fukuzawa |
| 6,364,746 B2 | 4/2002 | Moore |
| 6,366,934 B1 | 4/2002 | Cheng et al. |
| 6,368,879 B1 | 4/2002 | Toprac |
| 6,368,883 B1 | 4/2002 | Bode et al. |
| 6,368,884 B1 | 4/2002 | Goodwin et al. |
| 6,379,980 B1 | 4/2002 | Toprac |
| 6,388,253 B1 | 5/2002 | Su |
| 6,389,491 B1 | 5/2002 | Jacobson et al. |
| 6,395,152 B1 | 5/2002 | Wang |
| 6,397,114 B1 | 5/2002 | Eryurek et al. |
| 6,399,501 B2 | 6/2002 | Birang et al. |
| 6,405,096 B1 | 6/2002 | Toprac et al. |
| 6,405,144 B1 | 6/2002 | Toprac et al. |
| 6,422,927 B1 | 7/2002 | Zuniga |
| 6,435,952 B1 | 8/2002 | Boyd et al. |
| 6,438,438 B1 | 8/2002 | Takagi et al. |
| 6,440,295 B1 | 8/2002 | Wang |
| 6,455,937 B1 | 9/2002 | Cunningham |
| 6,461,964 B2 | 10/2002 | Hofmann et al. |
| 6,464,560 B2 | 10/2002 | Sandhu et al. |
| 6,464,561 B2 | 10/2002 | Sandhu et al. |
| 6,464,564 B2 | 10/2002 | Sandhu et al. |
| 6,464,824 B1 | 10/2002 | Hofmann et al. |
| 6,468,912 B2 | 10/2002 | Hofmann et al. |
| 6,470,230 B1 | 10/2002 | Toprac et al. |
| 6,472,325 B2 | 10/2002 | Hofmann et al. |
| 6,479,902 B1 | 11/2002 | Lopatin et al. |
| 6,479,990 B2 | 11/2002 | Mednikov et al. |
| 6,482,660 B2 | 11/2002 | Conchieri et al. |
| 6,488,566 B2 | 12/2002 | Sandhu et al. |
| 6,492,273 B1 | 12/2002 | Hofmann et al. |
| 6,503,839 B2 | 1/2003 | Gonzales et al. |
| 6,514,853 B1 | 2/2003 | Matsubara |
| 6,517,413 B1 | 2/2003 | Hu et al. |
| 6,517,668 B2 | 2/2003 | Agarwa |
| 6,520,834 B1 | 2/2003 | Marshall |
| 6,534,328 B1 * | 3/2003 | Hewett et al. .................... 438/8 |
| 6,540,588 B2 | 4/2003 | Moore |
| 6,540,591 B1 | 4/2003 | Pasadyn et al. |
| 6,567,717 B2 | 5/2003 | Krivokapic et al. |
| 6,602,724 B2 | 8/2003 | Redeker et al. |
| 6,623,333 B1 | 9/2003 | Patel et al. |
| 6,640,151 B1 | 10/2003 | Somekh et al. |
| 6,708,074 B1 | 3/2004 | Chi et al. |
| 6,746,958 B1 | 6/2004 | Hewett et al. |
| 6,747,734 B1 | 6/2004 | Ritzdorf et al. |
| 6,776,692 B1 | 8/2004 | Zuniga et al. |
| 6,782,337 B2 * | 8/2004 | Wack et al. .................... 702/155 |
| 6,910,947 B2 | 6/2005 | Paik |
| 6,913,938 B2 | 7/2005 | Shanmugasundram et al. |
| 6,939,198 B1 | 9/2005 | Swedek et al. |
| 6,950,716 B2 | 9/2005 | Ward et al. |
| 6,984,198 B2 | 1/2006 | Krishnamurthy et al. |
| 7,047,099 B2 | 5/2006 | Shanmugasundram et al. |
| 7,069,101 B1 | 6/2006 | Arackaparambil et al. |
| 7,082,345 B2 | 7/2006 | Shanmugasundram et al. |
| 7,097,534 B1 | 8/2006 | Yampolskiy |
| 7,101,799 B2 | 9/2006 | Paik |
| 7,160,739 B2 | 1/2007 | Shanmugasundram et al. |
| 7,174,230 B2 | 2/2007 | Arackaparambil et al. |
| 7,188,142 B2 | 3/2007 | Chi |
| 7,201,936 B2 | 4/2007 | Schwarm et al. |
| 7,225,047 B2 | 5/2007 | Al-Bayati et al. |
| 7,337,019 B2 | 2/2008 | Reiss et al. |
| 2001/0001755 A1 | 5/2001 | Sandhu et al. |
| 2001/0003084 A1 | 6/2001 | Finarov |
| 2001/0030366 A1 | 10/2001 | Nakano et al. |
| 2001/0039462 A1 | 11/2001 | Mendez et al. |
| 2001/0040997 A1 | 11/2001 | Tsap et al. |
| 2001/0042690 A1 | 11/2001 | Talieh |
| 2002/0032499 A1 | 3/2002 | Wilson et al. |
| 2002/0058460 A1 | 5/2002 | Lee et al. |
| 2002/0070126 A1 | 6/2002 | Sato et al. |
| 2002/0081951 A1 | 6/2002 | Boyd et al. |
| 2002/0089676 A1 | 7/2002 | Pecen et al. |
| 2002/0102853 A1 | 8/2002 | Li et al. |
| 2002/0107599 A1 | 8/2002 | Patel et al. |
| 2002/0107604 A1 | 8/2002 | Riley et al. |
| 2002/0107650 A1 * | 8/2002 | Wack et al. .................... 702/81 |
| 2002/0113039 A1 | 8/2002 | Mok et al. |
| 2002/0127950 A1 | 9/2002 | Hirose et al. |
| 2002/0128735 A1 | 9/2002 | Hawkins et al. |
| 2002/0128805 A1 | 9/2002 | Goldman et al. |
| 2002/0138321 A1 | 9/2002 | Yuan et al. |
| 2002/0149359 A1 | 10/2002 | Crouzen et al. |
| 2002/0185658 A1 | 12/2002 | Inoue et al. |
| 2002/0192966 A1 | 12/2002 | Shanmugasundram et al. |
| 2002/0193899 A1 | 12/2002 | Shanmugasundram et al. |
| 2002/0193902 A1 | 12/2002 | Shanmugasundram et al. |
| 2002/0197745 A1 | 12/2002 | Shanmugasundram et al. |
| 2002/0197934 A1 | 12/2002 | Paik |
| 2002/0199082 A1 | 12/2002 | Shanmugasundram et al. |
| 2003/0020909 A1 | 1/2003 | Adams et al. |

| | | |
|---|---|---|
| 2003/0020928 A1 | 1/2003 | Ritzdorf et al. |
| 2003/0037090 A1 | 2/2003 | Koh |
| 2003/0199112 A1 | 10/2003 | Shanmugasundram et al. |
| 2004/0015335 A1 | 1/2004 | Kokotov et al. |

FOREIGN PATENT DOCUMENTS

| | | |
|---|---|---|
| CA | 2165847 | 8/1991 |
| CA | 2194855 | 8/1991 |
| DE | 3801969 A | 7/1989 |
| EP | 0 621 522 A2 | 10/1994 |
| EP | 0 747 795 A2 | 12/1996 |
| EP | 0 869 652 | 10/1998 |
| EP | 0 877 308 A2 | 11/1998 |
| EP | 0879678 A | 11/1998 |
| EP | 0 881 040 A2 | 12/1998 |
| EP | 0 895 145 A1 | 2/1999 |
| EP | 0904895 A | 3/1999 |
| EP | 0 910 123 | 4/1999 |
| EP | 0 932 194 | 7/1999 |
| EP | 1 066 925 A2 | 1/2001 |
| EP | 1 067 757 A1 | 1/2001 |
| EP | 1 071 128 A2 | 1/2001 |
| EP | 1 092 505 A2 | 4/2001 |
| EP | 1 072 967 A3 | 11/2001 |
| EP | 1 182 526 A2 | 2/2002 |
| GB | 2 347 885 A | 9/2000 |
| JP | 61-66104 | 4/1986 |
| JP | 61-171147 | 8/1986 |
| JP | 01-283934 | 11/1989 |
| JP | 3-202710 | 9/1991 |
| JP | 05-151231 | 6/1993 |
| JP | 05-216896 | 8/1993 |
| JP | 05-266029 | 10/1993 |
| JP | 06/110894 | 4/1994 |
| JP | 06-176994 | 6/1994 |
| JP | 06-184434 | 7/1994 |
| JP | 06-252236 | 9/1994 |
| JP | 06-260380 | 9/1994 |
| JP | 8-23166 | 1/1996 |
| JP | 08-50161 | 2/1996 |
| JP | 08/50161 | 2/1996 |
| JP | 08-149583 | 6/1996 |
| JP | 08-304023 | 11/1996 |
| JP | 09-34535 | 2/1997 |
| JP | 0914828 | 6/1997 |
| JP | 9-246547 | 9/1997 |
| JP | 10-34522 | 2/1998 |
| JP | 10-173029 | 6/1998 |
| JP | 11-67853 | 3/1999 |
| JP | 11-126816 | 5/1999 |
| JP | 11-135601 | 5/1999 |
| JP | 2000-183001 | 6/2000 |
| JP | 2001-76982 | 3/2001 |
| JP | 2001-284299 | 10/2001 |
| JP | 2001-305108 | 10/2001 |
| JP | 2002-9030 | 1/2002 |
| JP | 2002-343754 | 11/2002 |
| TW | 434103 | 5/2001 |
| TW | 436383 | 5/2001 |
| TW | 455938 | 9/2001 |
| TW | 455976 | 9/2001 |
| WO | WO 95/34866 | 12/1995 |
| WO | WO 98/05066 | 2/1998 |
| WO | WO 98/45090 | 10/1998 |
| WO | WO 99/09371 | 2/1999 |
| WO | WO 99/25520 | 5/1999 |
| WO | WO 99/58200 | 11/1999 |
| WO | WO 00/00874 | 1/2000 |
| WO | WO 00/05759 | 2/2000 |
| WO | WO 00/35063 | 6/2000 |
| WO | WO 00/54325 | 9/2000 |
| WO | WO 00/79355 | 12/2000 |
| WO | WO 00/79355 A1 | 12/2000 |
| WO | WO 01/15865 | 3/2001 |
| WO | WO 01/15865 A1 | 3/2001 |
| WO | WO 01/18623 | 3/2001 |
| WO | WO 01/25865 | 4/2001 |
| WO | WO 01/33277 | 5/2001 |
| WO | WO 01/33501 | 5/2001 |
| WO | WO 01/33501 A1 | 5/2001 |
| WO | WO 01/52055 | 7/2001 |
| WO | WO 01/52055 A3 | 7/2001 |
| WO | WO 01/52319 | 7/2001 |
| WO | WO 01/57823 | 8/2001 |
| WO | WO 01/57823 A2 | 8/2001 |
| WO | WO 02/17150 A1 | 2/2002 |
| WO | WO 02/31613 A2 | 4/2002 |
| WO | WO 02/31613 A3 | 4/2002 |
| WO | WO 02/33737 A2 | 4/2002 |
| WO | WO 02/074491 | 9/2002 |

OTHER PUBLICATIONS

U.S. Appl. No. 09/903,052, filed Jul. 10, 2001, Yampolsky, et al., 18 pages.
U.S. Appl. No. 10/920,701, filed Aug. 17, 2004, Bennett, et al., 28 pages.
U.S. Appl. No. 10/920,726, filed Aug. 17, 2004, David et al., 34 pages.
Cheung, Robin. Oct. 18, 2000. "Copper Interconnect Technology." AVS/CMP User Group Meeting, Santa Clara, CA.
ACM Research, Inc. 2002. "ACM Ultra ECP® System: Electro-Copper Plating (ECP) Deposition."
KLA-Tencor Corporation. 2002. "KLA Tencor: Press Release: KLA-Tencor Introduces First Production-Worthy Copper CMP In-Situ Film Thickness and End-point Control System: Multi-Million Dollar Order Shipped to Major CMP Tool Manufacturer." www.kla-tencor.com/news_events/press_releases/press_releases2001/984086002.html.
Adams, Bret W., Bogdan Swedek, Rajeev Bajaj, Fritz Redeker, Manush Birang, and Gregory Amico. "Full-Wafer Endpoint Detection Improves Process Control in Copper CMP." Semiconductor Fabtech—12$^{th}$ Edition. Applied Materials, Inc., Santa Clara, CA, Jun. 1, 2000.
Williams, Randy, Dadi Gudmundsson, Kevin Monahan, Raman Nurani, Meryl Stoller and J. George Shanthikumar. Oct. 1999. "Optimized Sample Planning for Wafer Defect Inspection," *Semiconductor Manufacturing Conference Proceedings, 1999 IEEE International Symposium on Santa Clara, CA*. Picataway, NJ, 43-46.
Jul. 23, 2003. Invitation to Pay Additional Fees and Communication Relating to the Results of the Partial International Search for PCT/US02/19116.
Aug. 20, 2003. Written Opinion for PCT/US01/22833.
U.S. Appl. No. 09/363,966, filed Jul. 29, 1999, Arackaparambil et al., "Computer Integrated Manufacturing Techniques".
U.S. Appl. No. 09/469,227, filed Dec. 22, 1999, Somekh et al., Multi-Tool Control System, Method and Medium.
U.S. Appl. No. 09/619,044, filed Jul. 19, 2000, Yuan, System and Method of Exporting or Importing Object Data in a Manufacturing Execution System.
U.S. Appl. No. 09/637,620, filed Aug. 11, 2000, Chi et al., "Generic Interface Builder".
U.S. Appl. No. 09/656,031, filed Sep. 6, 2000, Chi et al., Dispatching Component for Associating Manufacturing Facility Service Requestors with Service Providers.
U.S. Appl. No. 09/655,542, filed Sep. 6, 2000, Yuan, "System, Method and Medium for Defining Palettes to Transform an Application Program Interface for a Service".
U.S. Appl. No. 09/725,908, filed Nov. 30, 2000, Chi et al., Dynamic Subject Information Generation in Message Services of Distributed Object Systems.
U.S. Appl. No. 09/800,980, filed Mar. 8, 2001, Hawkins et al., "Dynamic and Extensible Task Guide".
U.S. Appl. No. 09/811,667, filed Mar. 20, 2001, Yuan et al., "Fault Tolerant and Automated Computer Software Workflow".
U.S. Appl. No. 09/927,444, filed Aug. 13, 2001, Ward et al., "Dynamic Control of Wafer Processing Paths in Semiconductor Manufacturing Processes".
U.S. Appl. No. 09/928,473, filed Aug. 14, 2001, Koh "Tool Services Layer for Providing Tool Service Functions in Conjunction with Tool Functions".
U.S. Appl. No. 09/928,474, filed Aug. 14, 2001, Krishnamurthy et al., "Experiment Management System, Method and Medium".

U.S. Appl. No. 09/943,383, filed Aug. 31, 2001, Shanmugasundram et al., "In Situ Sensor Based Control of Semiconductor Processing Procedure".

U.S. Appl. No. 09/943,955, filed Aug. 31, 2001, Shanmugasundram et al., Feedback Control of a Chemical Mechanical Polishing Device Providing Manipulation of Removal Rate Profiles.

U.S. Appl. No. 09/998,372, filed Nov. 30, 2001, Paik, "Control of Chemical Mechanical Polising Pad Conditioner Directional Velocity to Improve Pad Life".

U.S. Appl. No. 09/998,384, filed Nov. 30, 2001, Paik, "Feedforward and Feedback Control for Conditioning of Chemical Mechanical Polishing Pad".

U.S. Appl. No. 10/084,092, filed Feb. 28, 2002, Arackaparambil et al., "Computer Integrated Manufacturing Techniques".

U.S. Appl. No. 10/100,184, filed Mar. 19, 2002, Al-Bayati et al., "Method, System and Medium for Controlling Semiconductor Wafer Processes Using Critical Dimension Measurements".

U.S. Appl. No. 10/135,405, filed May 1, 2002, Reiss et al., "Integration of Fault Detection with Run-to-Run Control".

U.S. Appl. No. 10/135,451, filed May 1, 2002, Shanmugasundram et al., "Dynamic Metrology Schemes and Sampling Schemes for Advanced Process Control in Semiconductor Processing".

U.S. Appl. No. 10/173,108, filed Jun. 18, 2002, Shanmugasundram et al., "Integrating Tool, Module, and Fab Level Control".

U.S. Appl. No. 10/174,370, filed Jun. 18, 2002, Shanmugasundram et al., "Feedback Control of Plasma-Enhanced Chemical Vapor Deposition Processes".

U.S. Appl. No. 10/174,377, filed Jun. 18, 2002, Schwarm et al., "Feedback Control of Sub-Atmospheric Chemical Vapor Deposition Processes".

U.S. Appl. No. 10/377,654, filed Mar. 4, 2003, Kokotov et al., "Method, System and Medium for Controlling Manufacturing Process Using Adaptive Models Based on Empirical Data".

Ostanin, Yu. Ya. Oct. 1981. Optimization of Thickness Inspection of Electrically Conductive Single-Layer.

Feb. 1984. "Method and Apparatus of in Situ Measurement and Overlay Error Analysis for Correcting Step".

Feb. 1984. "Substrate Screening Process." IBM Technical Disclosure Bulletin, pp. 4824-4825.

Oct. 1984. "Method to Characterize the Stability of a Step and Repeat Lithographic System." *IBM Technical Disclosure Bulletin*, pp. 2857-2860.

Levine, Martin D. 1985. Vision in Man and Machine. New York: McGraw-Hill, Inc. pp. ix-xii, 1-58.

Herrmann, D. 1988. "Temperature Errors and Ways of Elimination for Contactless Measurement of Shaft Vibrations (Abstract)." Technisches Messen™, vol. 55, No. 1, pp. 27-30. West Germany.

Lin, Kuang-Kuo and Costas J. Spanos. Nov. 1990. "Statistical Equipment Modeling for VLSI Manufacturing: An Application for LPCVD." IEEE Transactions on Semiconductor Manufacturing, v. 3, n. 4, pp. 216-229.

Runyan, W. R., and K. E. Bean. 1990. "Semiconductor Integrated Circuit Processing Technology." p. 48. Reading, Massachusetts: Addison-Wesley Publishing Company.

Chang, Norman H. and Costas J. Spanos. Feb. 1991. "Continuous Equipment Diagnosis Using Evidence Integration: An LPCVD Application." IEEE Transactions on Semiconductor Manufacturing, v. 4, n. 1, pp. 43 51.

Larrabee, G. B. May 1991. "The Intelligent Microelectronics Factory of the Future (Abstract)." IEEE/SEMI International Semiconductor Manufacturing Science Symposium, pp. 30-34. Burlingame, CA.

Burke, Peter A. Jun. 1991. "Semi-Empirical Modelling of SiO2 Chemical-Mechanical Polishing Planarization." VMIC Conference, 1991 IEEE, pp. 379-384. IEEE.

Zorich, Robert. 1991. Handbook of Quality Integrated Circuit Manufacturing. pp. 464-498 San Diego, California: Academic Press, Inc.

Rampalli, Prasad, Arakere Ramesh, and Nimish Shah. 1991. CEPT—A Computer-Aided Manufacturing Application for Managing Equipment Reliability and Availability in tjie Semiconductor Industry. New York, New York: IEEE.

May 1992. "Laser Ablation Endpoint Detector." IBM Technical Disclosure Bulletin, pp. 333-334.

Spanos, Costas J., Hai-Fang Guo, Alan Miller, and Joanne Levine-Parrill. Nov. 1992. "Real-Time Statistical Process Control Using Tool Data." IEEE Transactions on Semiconductor Manufacturing, v. 5, n. 4, pp. 308-318.

Feb. 1993. "Electroless Plating Scheme to Hermetically Seal Copper Features." IBM Technical Disclosure Bulletin, pp. 405-406.

Scan, J. M. and J. K. Zelisse. Apr. 1993. "New Topology for Thickness Monitoring Eddy Current Sensors (Abstract)." Proceedings of the Annual Technical Conference, Dallas, Texas.

Hu, Albert, Kevin Nguyen, Steve Wong, Xiuhua Zhang, Emanuel Sachs, and Peter Renteln. 1993. "Concurrent Deployment of Run by Run Controller Using SCC Framework." IEEE/SEMI International Semiconductor in Manufacturing Science Symposium: pp. 126-132.

Matsuyama, Akira and Jessi Niou. 1993. "A State-of-the-Art Automation System of an ASIC Wafer Fab in Japan." IEEE/SEMI International Semiconductor Manufacturing Science Syposium, pp. 42-47.

Yeh, C. Eugene, John C. Chang, and Kwan Wong. 1993. "Implementation Challenges of a Feedback Control System for Wafer Fabrication." IEEE/CHMT International Electronics Manufacturing Technology Symposium, pp. 438-442.

Kurtzberg, Jerome M. and Menachem Levanoni. Jan. 1994. "ABC: A Better Control for Manufacturing." IBM Journal of Research and Development, v. 38, n. 1, pp. 11-30.

Mozumder, Purnendu K. and Gabriel G. Barna. Feb. 1994. "Statistical Feedback Control of a Plasma Etch Process." IEEE Transactions on Semiconductor Manufacturing, v. 7, n. 1, pp. 1-11.

Muller-Heinzerling, Thomas, Ulrich Neu, Hans Georg Nurnberg, and Wolfgang May. Mar. 1994. "Recipe Controlled Operation of Batch Processes with Batch X." ATP Autornatisierungstechnische Praxis, vol. 36, No. 3, pp. 43-51.

Stoddard, K., P. Crouch, M. Kozicki, and K. Tsakalis. Jun.-Jul. 1994. "Application of Feedforward and Adaptive Feedback Control to Semiconductor Device Manufacturing (Abstract)." Proceedings of 1994 American Control Conference—ACC '94, vol. 1, pp. 892-896. Baltimore, Maryland.

Schaper, C., M. M. Moslehi, K. C. Saraswat, and T. Kailath. Nov. 1994. "Modeling, Identification, and Control of Rapid Thermal Processing Systems (Abstract)." Journal of the Electrochemical Society, vol. 141, No. 11, pp. 3200-3209.

Tao, K. M., R. L. Kosut, M. Ekblad, and G. Aral. Dec. 1994. "Feedforward Learning Applied to RTP of Semiconductor Wafers (Abstract)." Proceedings of the 33'd IEEE Conference on Decision and Control, vol. 1, pp. 67-72. Lake Buena Vista, Florida.

Hu, Albert, He Du, Steve Wong, Peter Renteln, and Emmanuel Sachs. 1994. "Application of Run by Run Controller to the Chemical-Mechanical Planarization Process." IEEE/CPMT International Electronics Manufacturing Technology Symposium, pp. 371-378.

Spanos, C. J., S. Leang, S.-Y. Ma, J. Thomson, B. Bombay, and X. Niu. May 1995. "A Multistep Supervisory Controller for Photolithographic Operations (Abstract)." Proceedings of the Symposium on Process Control, Diagnostics, and Modeling in Semiconductor Manufacturing, pp. 3-17.

Moyne, James, Roland Telfeyan, Arnon Hurwitz, and John Taylor. Aug. 1995. "A Process-Independent Run-to-Run Controller and Its Application to Chemical-Mechanical Planarization." SEMI/IEEE Advanced Semiconductor Manufacturing Conference and Workshop. Ann Arbor, Michigan: The University of Michigan, Electrical Engineering & Computer Science Center for Display Technology & Manufacturing.

Zhou, Zhen-Hong and Rafael Reif. Aug. 1995. "Epi-Film Thickness Measurements Using Emission Fourier Transform Infrared Spectroscopy—Part II: Real-Time in Situ Process Monitoring and Control." IEEE Transactions on Semiconductor Manufacturing, vol. 8, No. 3.

Telfeyan, Roland, James Moyne, Nauman Chaudhry, James Pugmire, Scott Shellman, Duane Boning, William Moyne, Arnon Hurwitz, and John Taylor. Oct. 1995. "A Multi-Level Approach to the Control of a Chemical-Mechanical Planarization Process." Minneapolis, Minnesota: 42° National Symposium of the American Vacuum Society.

Chang, E., B. Stine, T. Maung, R. Divecha, D. Boning, J. Chung, K. Chang, G. Ray, D. Bradbury, O. S. Nakagawa, S. Oh, and D. Bartelink. Dec. 1995. "Using a Statistical Metrology Framework to Identify Systematic and Random Sources of Die- and Wafer-level ILD Thickness Variation in CMP Processes." Washington, D.C.: International Electron Devices Meeting.

Moyne, James R., Nauman Chaudhry, and Roland Telfeyan. 1995. Adaptive Extensions to a Multi-Branch.

Run-to-Run Controller for Plasma Etching. Journal of Vacuum Science and Technology. Ann Arbor, Michigan: University of Michigan Display Technology Manufacturing Center, vol. 13 1995.

Schmid, Hans Albrecht. 1995. "Creating the Architecture of a Manufacturing Framework by Design Patterns." Austin, Texas: OOPSLA.

Dishon, G., M. Finarov, R. Kipper, J.W. Curry, T. Schraub, D. Trojan, 40' Stambaugh, Y. Li and J. Ben-Jacob. Feb. 1996. "On-Line Integrated Metrology for CMP Processing." Santa Clara, California: VMIC Speciality Conferences, 1st International CMP Planarization Conference.

Leang, Sovarong, Shang-Yi Ma, John Thomson, Bart John Bombay, and Costas J. Spanos. May 1996. "A Control System for Photolithographic Sequences." IEEE Transactions on Semiconductor Manufacturing, vol. 9, No. 2.

Smith, Taber, Duane Boning, James Moyne, Arnon Hurwitz, and John Curry. Jun. 1996. "Compensating for CMP Pad Wear Using Run by Run Feedback Control." Santa Clara, California: Proceedings of the Thirteenth International VLSI Multilevel Interconnection Conference. pp. 437-439.

Boning, Duane S., William P. Moyne, Taber H. Smith, James Moyne, Ronald Telfeyan, Arnon Hurwitz, Scott Shellman, and John Taylor. Oct. 1996. "Run by Run Control of Chemical-Mechanical Polishing." IEEE Transactions on Components, Packaging, and Manufacturing Technology—Part C, vol. 19, No. 4, pp. 307-314.

Zhe, Ning, J. R. Moyne, T. Smith, D. Boning, E. Del Castillo, Yeh Jinn-Yi, and Hurwitz. Nov. 1996.. "A Comparative Analysis of Run-to-Run Control Algorithms in Semiconductor Manufacturing Industry (Abstract)." IEEE/SEMI 1996 Advanced Semiconductor Manufacturing Conference Workshop, pp. 375-381.

Yasuda, M., T. Osaka, and M. Ikeda. Dec. 1996. "Feedforward Control of a Vibration Isolation System for Disturbance Suppression (Abstract)." Proceeding of the 35th IEEE Conference on Decision and Control, vol. 2, pp. 1229-1233. Kobe, Japan.

Fan, Jr-Min, Ruey-Shan Guo, Shi-Chung Chang, and Kian-Huei Lee. 1996. "Abnormal Trend Detection of Sequence-Disordered Data Using EWMA Method." IEEE/SEMI Advanced Semiconductor Manufacturing Conference, pp. 169-174.

SEMI. [1986] 1996. "Standard for Definition and Measurement of Equipment Reliability, Availability, and Maintainability (RAM)." SEMI E10-96.

Smith, Taber and Duane Boning. 1996. "A Self-Tuning EWMA Controller Utilizing Artificial Neural Network Function Approximation Techniques." IEEE/CPMT International Electronics Manufacturing Technology Symposium, pp. 355-363.

Guo, Ruey-Shan, Li-Shia Huang, Argon Chen, and Jin-Jung Chen. Oct. 1997. "A Cost-Effective Methodology for a Run-by-Run EWMA Controller." 6th International Symposium on Semiconductor Manufacturing, pp. 61-64.

Mullins, J. A., W. J. Campbell, and A. D. Stock. Oct. 1997. "An Evaluation of Model Predictive Control in Run-to-Run Processing in Semiconductor Manufacturing (Abstract)." Proceedings of the SPIE—The International Society for Optical Engineering Conference, vol. 3213, pp. 182-189.

Reitman, E. A., D. J. Friedman, and E. R. Lory. Nov. 1997. "Pre-Production Results Demonstrating Multiple-System Models for Yield Analysis (Abstract)." IEEE Transactions on Semiconductor Manufacturing, vol. 10, No. 4, pp. 469-481.

Durham, Jim and Myriam Roussel. 1997. "A Statistical Method for Correlating In-Line Defectivity to Probe Yield." IEEE/SEMI Advanced Semiconductor Manufacturing Conference, pp. 76-77.

Shindo, Wataru, Eric H. Wang, Ram Akella, and Andrzej J. Strojwas. 1997. "Excursion Detection and Source Isolation in Defect Inspection and Classification." 2"d International Workshop on Statistical Metrology, pp. 90 93.

Van Zant, Peter. 1997. Microchip Fabrication: A Practical Guide to Semiconductor Processing. Third Edition, pp. 472-478. New York, New York: McGraw-Hill.

Campbell, W. Jarrett, and Anthony J. Toprac. Feb. 11-12, 1998. "Run-to-Run Control in Microelectronics Manufacturing." Advanced Micro Devises, TWMCC.

Edgar, Thomas F., Stephanie W. Butler, Jarrett Campbell, Carlos Pfeiffer, Chris Bode, Sung Bo Hwang, and K.S. Balakrishnan. May 1998. "Automatic Control in Microelectronics Manufacturing: Practices, Challenges, and Possibilities." Automatica, vol. 36, pp. 1567-1603, 2000.

Moyne, James, and John Curry. Jun. 1998. "A Fully Automated Chemical-Mechanical Planarization Process."

Jul. 1998. "Active Controller: Utilizing Active Databases for Implementing Multistep Control of Semiconductor Manufacturing (Abstract)." IEEE Transactions on Components, Packaging and Manufacturing Technology—Part C, vol. 21, No. 3, pp. 217-224.

SEMI. Jul. 1998. New Standard; Provisional Specification for CIM Framework Domain Architecture. Mountain View, California: Semi Standards. SEMI Draft Doc. 2817.

Consilium. Aug. 1998. Quality Management Component: QMCrM and QMC-Link™ Overview. Mountain View, California: Consilium, Inc.

Chemali, Chadi El, James Moyne, Kareemullah Khan, Rock Nadeau, Paul Smith, John Colt, Jonathan Chapple-Sokol, and Tarun Parikh. Nov. 1998. "Multizone Uniformity Control of a CMP Process Utilizing a Pre and Post-Measurement Strategy." Seattle, Washington: SEMETECH Symposium.

Consilium. 1998. FAB300TM. Mountain View, California: Consilium, Inc.

Fang, S. J., A. Barda, T. Janecko, W. Little, D. Outley, G. Hempel, S. Joshi, B. Morrison, G. B. Shinn, and M. Birang. 1998. "Control of Dielectric Chemical Mechanical Polishing (CMP) Using and Interferometry Based Endpoint Sensor." International Proceedings of the IEEE Interconnect Technology Conference, pp. 76-78.

Khan, Kareemuliah, Victor Solakhain, Anthony Ricci, Tier Gu, and James Moyne. 1998. "Run-to-Run Control of ITO Deposition Process." Ann Arbor. Michigan.

Ouma, Dennis, Duane Boning, James Chung, Greg Shinn, Leif Olsen, and John Clark. 1998. "An Integrated Characterization and Modeling Methodology for CMP Dielectric Planarization." Proceedings of the IEEE 1998 International Interconnect Technology Conference, pp. 67-69.

Suzuki, Junichi and Yoshikazu Yamamoto. 1998.—Toward the Interoperable Software Design Models: Quartet of UML, XML, DOM and CORBA. Proceedings IEEE International Software Engineering Standards Symposium. pp. 1-10.

Consilium. Jan. 1999. "FAB300™: Consilium's Next Generation MES Solution of Software and Services which Control and Automate Real-Time FAB Operations." www.consilium.corn/products/fab300_page.htm#FAB300 Introduction.

Boning, Duane S., Jerry Stefani, and Stephanie W. Butler. Feb. 1999. "Statistical Methods for Semiconductor Manufacturing." Encyclopedia of Electrical Engineering, J. E. Webster, Ed.

McIntosh, John. Mar. 1999. "Using CD-SEM Metrology in the Manufacture of Semiconductors (Abstract)." JOM, vol. 51, No. 3, pp. 38-39.

Pan, J. Tony, Ping Li, Kapila Wijekoon, Stan Tsai, and Fritz Redeker. May 1999. "Copper CMP Integration and Time Dependent Pattern Effect" IEEE 1999 International Interconnect Technology Conference, pp. 164 166.

Klein, Bruce. Jun. 1999. "Application Development: XML Makes Object Models More Useful." Informationweek. pp. 1A-6A.

Baliga, John. Jul. 1999. "Advanced Process Control: Soon to be a Must." Cahners Semiconductor International. www.semiconductor.net/semiconductor/issues/issues/1999/jul99/docs/feature1.asp.

Consilium. Jul. 1999. "Increasing Overall Equipment Effectiveness (OEE) in Fab Manufacturing by Implementing Consilium's Next-Generation Manufacturing Execution System—MES II." Semiconductor Fabtech Edition 10.

Meckl, P. H. and K. Umemoto. Aug. 1999. "Achieving Fast Motions in Semiconductor Manufacturing Machinery (Abstract)." Proceedings of the 1999 IEEE International Conference on Control Applications, vol. 1, pp. 725-729. Kohala Coast, HI.

Consilium Corporate Brochure. Oct. 1999. www.consilium.com.

Khan, K., C. El Chemali, J. Moyne, J. Chapple-Sokol, R. Nadeau, P. Smith, C., and T. Parikh. Oct. 1999. "Yield Improvement at the Contact Process Through Run-to-Run Control (Abstract)." IEEE/CPMT Electronics Manufacturing Technology Symposium, pp. 258-263.

Moyne, James. Oct. 1999. "Advancements in CMP Process Automation and Control." Hawaii: (Invited paper and presentation to) Third International Symposium on Chemical Mechanical Polishing in IC Device Manufacturin g: 196 6 Meetin g of the Electrochemical Society.

Consilium. Nov. 1999. FAB300™ Update.

Ruegsegger, Steven, Aaron Wagner, James S. Freudenberg, and Dennis S. Grimard. Nov. 1999. "Feedforward Control for Reduced Run-to-Run Variation in Microelectronics Manufacturing." IEEE Transactions on Semiconductor Manufacturing, vol. 12, No. 4.

Nov. 1999. "How to Use EWMA to Achieve SPC and EPC Control." International Symposium on NDT Contribution to the Infrastructure Safety Systems, Tores, Brazil. <http://www.ndt.net/abstractlndtiss99/data/35.htm>.

Edgar, T. F., W. J. Campbell, and C. Bode. Dec. 1999. "Model-Based Control in Microelectronics Manufacturing." Proceedings of the 38'h IEEE Conference on Decision and Control, Phoenix, Arizona, vol. 4, pp. 4185-4191.

Mecld, P. H. and K. Umemoto. Apr. 2000. "Achieving Fast Motions by Using Shaped Reference Inputs [Semiconductor Manufacturing Machine] (Abstract)." NEC Research and Development, vol. 41,—No. 2, pp. 232 237.

Chemali, Chadi El, James Moyne, Kareernullah Khan, Rock Nadeau, Paul Smith, John Colt, Jonathan Chapple Sokol, and Tarun Parikh. Jul./Aug. 2000. "Multizone Uniformity Control of a Chemical Mechanical Polishing Process Utilizing a Pre- and Postmeasurement Strategy." J. Vac. Sci. Technol. A, vol. 18(4). pp. 1287-1296. American Vacuum Society.

Oechsner, R., T. Tschaftary, S. Sommer, L. Pfitzner, H. Ryssel, H. Gerath, C. Baier, and M. Hafner. Sep. 2000. "Feed-forward Control for a Lithography/Etch Sequence (Abstract)." Proceedings of the SPIE—The International Society for Optical Engineering Conference, vol. 4182, pp. 31-39.

Edgar, Thomas F., Stephanie W. Butler, W. Jarrett Campbell, Carlos Pfeiffer, Christopher Bode, Sung Bo Hwang, K. S. Balakrishnan, and J. Hahn. Nov. 2000. "Automatic Control in Microelectronics Manufacturing: Practices, Challenges, and Possibilities (Abstract)." Automatica, v. 36, n. 11.

Khan, S., M. Musavi, and H. Ressom. Nov. 2000. "Critical Dimension Control in Semiconductor Manufacturing (Abstract)." ANNIE 2000. Smart Engineering Systems Design Conference, pp. 995-1000. St. Louis, Missouri.

ACM Research Inc. 2000. "Advanced Copper Metallization for 0.13 to 0.05 pm & Beyond." <http://acmrc.corn/press/ACM-ECP-brochure.pdf>.

Ravid, Avi, Avner Sharon, Amit Weingarten, Vladimir Machavariani, and David Scheiner. 2000. "Copper CMP Planarity Control Using ITM." IEEE/SEMI Advanced Semiconductor Manufacturing Conference, pp. 437-443.

SEMI. 2000. "Provisional Specification for CIM Framework Scheduling Component." San Jose, California. SEMI E105-1000.

Chen, Argon and Ruey-Shan Gun. Feb. 2001. "Age-Based Double EWMA Controller and its Application to CMP Processes." IEEE Transactions on Semiconductor Manufacturing, vol. 14, No. 1, pp. 11-19.

Lee, Brian, Duane S. Boning, Winthrop Baylies, Noel Poduje, Pat Hester, Yong Xia, John Valley, Chris Koliopoulus, Dale Hetherington, HongJiang Sun, and Michael Lacy. Apr. 2001. "Wafer Nanotopography Effects on CMP: Experimental Validation of Modeling Methods." San Francisco, California: Materials Research Society Spring Meeting.

Tobin, K. W., T. P. Karnowski, L. F. Arrowood, and F. Lakhani. Apr. 2001. "Field Test Results of an Automated Image Retrieval System (Abstract)." Advanced Semiconductor Manufacturing Conference, 2001 IEEE/SEMI, Munich, Germany.

Tan, K. K., H. F. Dou, and K. Z. Tang. May-Jun. 2001. "Precision Motion Control System for Ultra-Precision Semiconductor and Electronic Components Manufacturing (Abstract)." 51' Electronic Components and Technology Conference 2001. Proceedings, pp. 1372-1379. Orlando, Florida.

Jensen, Alan, Peter Renteln, Stephen Jew, Chris Raeder, and Patrick Cheung. Jun. 2001. "Empirical-Based Modeling for Control of CMP Removal Uniformity." Solid State Technology, vol. 44, No. 6, pp. 101-102, 104, 106. Cowan Publ. Corp.: Washington, D.C.

Jul. 5, 2001. "Motorola and Advanced Micro Devices Buy ObjectSpace Catalyst Advanced Process Control Product for Five Wafer Fabs." Semiconductor FABTECH.www.semiconductorfabtech.cornlindustry.news/9907/20.07.shtml.

Heuberger, U. Sep. 2001. "Coating Thickness Measurement with Dual-Function Eddy-Current & Magnetic Inductance Instrument (Abstract)." Galvanotechnik, vol. 92, No. 9, pp. 2354-2366+IV.

Pilu, Maurizio. Sep. 2001. "Undoing Page Curl Distortion Using Applicable Surfaces." IEEE International Conference on Image Processing. Thessalonica, Greece.

Oct. 15, 2001. Search Report prepared by the Austrian Patent Office for Singapore Patent Application No. 200004286-1.

Wang, LiRen and Hefin Rowlands. 2001. "A Novel NN-Fuzzy-SPC Feedback Control System." 8'" IEEE International Conference on Emerging Technologies and Factory Automation, pp. 417-423.

NovaScan 2020. Feb. 2002. "Superior Integrated Process Control for Emerging CMP High-End Applications."

Moyne, J., V. Solakhian, A. Yershov, M. Anderson, and D. Mockler-Hebert. Apr.-May 2002. "Development and Deployment of a Multi-Component Advanced Process Control System for an Epitaxy Tool (Abstract)." 2002 IEEE Advanced Semiconductor Manufacturing Conference and Workshop, pp. 125-130.

Sarfaty, Moshe, Arulkumar Shanmugasundram, Alexander Schwarm, Joseph Paik, Jimin Zhang, Rong Pan, Martin J. Seamons, Howard Li, Raymond Hung, and Suketu Parikh. Apr.-May 2002. "Advance Process Control Solutions for Semiconductor Manufacturing." 13'h Annual IEEE/SEMI Advanced Semiconductor Manufacturing Conference. Advancing the Science and Technology of Semiconductor Manufacturing. ASMC 2002, pp. 101-106. Boston, MA.

Campbell, W. J., S. K. Firth, A. J. Toprac, and T. F. Edgar. May 2002. "A Comparison of Run-to-Run Control Algorithms (Abstract)." Proceedings of 2002 American Control Conference, vol. 3, pp. 2150-2155.

Good, Richard and S. Joe Qin. May 2002. "Stability Analysis of Double EWMA Run-to-Run Control with Metrology Delay." IEEE/CPMT International Electronics Manufacturing Technology Symposium, pp. 355-363.

Smith, Stewart, Anthony J. Walton, Alan W. S. Ross, Georg K. H. Bodammer, and J. T. M. Stevenson. May 2002. "Evaluation of Sheet Resistance and Electrical Linewidth Measurement Techniques for Copper Damascene Interconnect." IEEE Transactions on Semiconductor Manufacturing, vol. 15, No. 2, pp. 214-222.

Johnson, Bob. Jun. 10, 2002. "Advanced Process Control Key to Moore's Law." Gartner, Inc.

Itabashi, Takeyuki, Hiroshi Nakano, and Haruo Akahoshi. Jun. 2002. "Electroless Deposited CoWB for Copper Diffusion Barrier Metal." IEEE International interconnect Technology Conference, pp. 285-287.

Jul. 9, 2002. International Search Report for PCT/US01/24910.
Jul. 23, 2002. Communication Pursuant to Article 96(2) EPC for European Patent Application No. 00 115 577.9.
Jul. 29, 2002. International Search Report for PCT/US01/27407.
Oct. 4, 2002. International Search Report for PC T/US01/22833.
Oct. 15, 2002. International Search Report for PCT/US02/19062.
Oct. 23, 2002. International Search Report for PCT/US01/27406.
Nov. 7, 2002. International Search Report for PCT/US02/19061.
Nov. 11, 2002. International Search Report for PCT/US02/19117.
Nov. 12, 2002. International Search Report for PCT/US02/19063.
Sonderman, Thomas. 2002. "APC as a Competitive Manufacturing Technology: AMD's Vision for 300mm." AEC/APC.

Takahashi, Shingo, Kaori Tai, Hiizu Ohtorii, Naoki Komai, Yuji Segawa, Hiroshi Horikoshi, Zenya Yasuda, Hiroshi Yamada, Masao Ishihara, and Takeshi Nogami. 2002. "Fragile Porous Low-k/Copper Integration by Using Electro-Chemical Polishing." 2002 Symposium on VLSI Technology Digest of Technical Papers, pp. 32 33.

Cunningham, James A. 2003. "Using Electrochemistry to Improve Copper Interconnects." <http://www.e insi te. net/semiconductor/index.asp?layout=article&articleid=CA47465>.
Mar. 25, 2003. International Search Report for PCT/US02/24859 prepared by the European Patent Office.
May 23, 2003 Written Opinion fnr PCTIUeni i)norn.
Berman, Mike, Thomas Bibby, and Alan Smith. "Review of In Situ & In-line Detection for CMP Applications." Semiconductor Fabtech, 8th Edition, pp. 267-274, Aug. 1993.
Dishon, G., D. Eylon, M. Finarov, and A. Shulman. "Dielectric CMP Advanced Process Control Based on Integrated Monitoring." Ltd. Rehoveth, Israel: Nova Measuring Instruments, 1998.
"Semiconductor Manufacturing: An Overview." <http://users.ece.gatech.edul-gmay/overview.html>, Jul. 2010.
U.S. Appl. No. 09/619,044, filed May 13, 2003, Yuan.
U.S. Appl. No. 09/656,031, filed Sep. 6, 2000, Chi et al.
"Active Controller: Utilizing Active Databases for Implementing Multistep Control of Semiconductor Manufacturing (Abstract)." *IEEE Transactions on Components, Packaging and Manufacturing Technology—Part C*, vol. 21, No. 3 (Jul. 1998), pp. 217-224.
"Semiconductor Manufacturing; An Overview." <http://users.ece.gatech.edu/—gmay/overview.html>, Jul. 2010.
ACM Research Inc. 2000. "Advanced Copper Metallization for 0.13 to 0.05 um & Beyond." <http://acmrc.com/press/ACM-ECP-brochure.pdf>.
ACM Research, Inc. 2002. "ACM Ultra ECP® System: Electro-Copper Plating (ECP) Deposition." www.acmrc.com/ecp.html.
Berman, Mike et al., "Review of In Situ & In-line Detection for CMP Applications." *Semiconductor Fabtech*, 8'$^h$ Edition, pp. 267-274, Aug. 1993.
Boning, Duane S., Jerry Stefani, and Stephanie W. Butler. Feb. 1999. "Statistical Methods for Semiconductor Manufacturing." *Encyclopedia of Electrical Engineering, J. G. Webster, Ed.*
Boning, Duane S., William P. Moyne, Taber H. Smith, James Moyne, Ronald Telfeyan, Arnon Hurwitz, Scott Shellman, and John Taylor. Oct. 1996. "Run by Run Control of Chemical-Mechanical Polishing." *IEEE Transactions on Components, Packaging, and Manufacturing Technology—Part C*, vol. 19, No. 4, pp. 307-314.
Burke, Peter A. Jun. 1991. "Semi-Empirical Modelling of SiO2 Chemical-Mechanical Polishing Planarization." VMIC Conference, 1991 IEEE, pp. 379-384. IEEE.
Campbell, W. J., S. K. Firth, A. J. Toprac, and T. F. Edgar. May 2002. "A Comparison of Run-to-Run Control Algorithms (Abstract)." *Proceedings of 2002 American Control Conference*, vol. 3, pp. 2150-2155.
Chang, E., B. Stine, T. Maung, R. Divecha, D. Boning, J. Chung, K. Chang, G. Ray, D. Bradbury, 0. S. Nakagawa, S. Oh, and D. Bartelink. Dec. 1995. "Using a Statistical Metrology Framework to Identify Systematic and Random Sources of Die- and Wafer-level ILD Thickness Variation in CMP Processes." Washington, D.C.: International Electron Devices Meeting.
Chang, Norman H. and Costas J. Spanos. Feb. 1991. "Continuous Equipment Diagnosis Using Evidence Integration: An LPCVD Application." IEEE Transactions on Semiconductor Manufacturing, v. 4, n. 1, pp. 4351.
Chemali, Chadi El et al., Jul./Aug. 2000. "Multizone Uniformity Control of a Chemical Mechanical Polishing Process Utilizing a Pre- and Postmeasurement Strategy." J. Vac. Sci. Technol. A, vol. 18(4). pp. 1287-1296. American Vacuum Society.
Chemali, Chadi El et al., Nov. 1998. "Multizone Uniformity Control of a CMP Process Utilizing a Pre and Post-Measurement Strategy." Seattle, Washington: SEMETECH Symposium.
Chen, Argon and Ruey-Shan Guo. Feb. 2001. "Age-Based Double EWMA Controller and its Application to CMP Processes." *IEEE Transactions on Semiconductor Manufacturing*, vol. 14, No. 1, pp. 11-19.
Consilium. 1998. *FAB300™*. Mountain View, California: Consilium, Inc.
Consilium. Aug. 1998. *Quality Management Component: QMC™ and QMC-Link™ Overview*. Mountain View, California: Consilium, Inc.
Consilium. Nov. 1999. *FAB300™ Update*.

Cunningham, James A. 2003. "Using Electrochemistry to Improve Copper Interconnects." <http://www.einsite.net/semiconductor/index.asp?layout=article&articleid=CA47465>.
Dishon, G., D. Eylon, M. Finarov, and A. Shulman. "Dielectric CMP Advanced Process Control Based on Integrated Monitoring." Ltd. Rehoveth, Israel: Nova Measuring Instruments, 1995.
Dishon, G., M. Finarov, R. Kipper, J.W. Curry, T. Schraub, D. Trojan, 4th Stambaugh, Y. Li and J. Ben-Jacob. Feb. 1996. "On-Line Integrated Metrology for CMP Processing." Santa Clara, California: VMIC Speciality Conferences, 1st International CMP Planarization Conference.
Durham, Jim and Myriam Roussel. 1997. "A Statistical Method for Correlating In-Line Defectivity to Probe Yield." *IEEE/SEMI Advanced Semiconductor Manufacturing Conference*, pp. 76-77.
Edgar, T. F., W. J. Campbell, and C. Bode. Dec. 1999. "Model-Based Control in Microelectronics Manufacturing." *Proceedings of the 38$^{th}$ IEEE Conference on Decision and Control*, Phoenix, Arizona, vol. 4, pp. 4185-4191.
Edgar, Thomas F., Stephanie W. Butler, Jarrett Campbell, Carlos Pfeiffer, Chris Bode, Sung Bo Hwang, and K.S. Balakrishnan. May 1998. "Automatic Control in Microelectronics Manufacturing: Practices, Challenges, and Possibilities." *Automatica*, vol. 36, pp. 1567-1603, 2000.
Fan, Jr-Min, Ruey-Shan Guo, Shi-Chung Chang, and Kian-Huei Lee. 1996. "Abnormal Trend Detection of Sequence-Disordered Data Using EWMA Method." *IEEE/SEMI Advanced Semiconductor Manufacturing Conference*, pp. 169-174.
Fang, S. J., A. Barda, T. Janecko, W. Little, D. Outley, G. Hempel, S. Jcishi, B. Morrison, G. B. Shinn, and M. Birang. 1998. "Control of Dielectric Chemical Mechanical Polishing (CMP) Using and Interferometry Based Endpoint Sensor." *International Proceedings of the IEEE Interconnect Technology Conference*, pp. 76-78.
Good, Richard and S. Joe Qin. May 2002. "Stability Analysis of Double EWMA Run-to-Run Control with Metrology Delay." *IEEE/CPMT International Electronics Manufacturing Technology Symposium*, pp. 355-363.
Guo, Ruey-Shan, Li-Shia Huang, Argon Chen, and Jin-Jung Chen. Oct. 1997. A Cost-Effective Methodology for a Run-by-Run EWMA Controller. *6$^{th}$ International Symposium on Semiconductor Manufacturing*, pp. 61-64.
Heuberger, U. Sep. 2001. "Coating Thickness Measurement with Dual-Function Eddy-Current & Magnetic Inductance Instrument (Abstract)." *Galvanotechnik*, vol. 92, No. 9, pp. 2354-2366+IV.
Hu, Albert, He Du, Steve Wong, Peter Renteln, and Emmanuel Sachs. 1994. "Application of Run by Run Controller to the Chemical-Mechanical Planarization Process." *IEEE/CPMT International Electronics Manufacturing Technology Symposium*, pp. 371-378.
Hu, Albert, Kevin Nguyen, Steve Wong, Xiuhua Zhang, Emanuel Sachs, and Peter Renteln. 1993. "Concurrent Deployment of Run by Run Controller Using SCC Framework." IEEE/SEMI International Semiconductor Manufacturing Science Symposium. pp. 126-132.
IBM Technical Disclosure Bulletin, "Substrate Screening Process.", Feb. 1984, pp. 4824-4825.
IBM Technical Disclosure Bulletin, "Electroless Plating Scheme to Hermetically Seal Copper Features.", Feb. 1993, pp. 405-406.
IBM Technical Disclosure Bulletin, "Method and Apparatus of in Situ Measurement and Overlay Error Analysis for Correcting Step and Repeat Lithographic Cameras.", Feb. 1984, pp. 4855-4859.
Itabashi, Takeyuki, Hiroshi Nakano, and Haruo Akahoshi. Jun. 2002. "Electroless Deposited CoWB for Copper Diffusion Barrier Metal." *IEEE International Interconnect Technology Conference*, pp. 285-287.
Jul. 5, 2001. "Motorola and Advanced Micro Devices Buy ObjectSpace Catalyst Advanced Process Control Product for Five Wafer Fabs." Semiconductor FABTECH. www.semiconductorfabtech.comfindustry.news/9907/20.07.shtml.
Khan, K., C. El Chemali, J. Moyne, J. Chapple-Sokol, R. Nadeau, P. Smith, C., and T. Parikh. Oct. 1999. "Yield Improvement at the Contact Process Through Run-to-Run Control (Abstract)." *24$^{th}$ IEEE/CPMT Electronics Manufacturing Technology Symposium*, pp. 258-263.

Khan, Kareemullah, Victor Solakhain, Anthony Ricci, Tier Gu, and James Moyne. 1998. "Run-to-Run Control of ITO Deposition Process." Ann Arbor, Michigan.

Khan, S., M. Musavi, and H. Ressom. Nov. 2000. "Critical Dimension Control in Semiconductor Manufacturing (Abstract)." *ANNIE 2000. Smart Engineering Systems Design Conference*, pp. 995-1000. St. Louis, Missouri.

Kurtzberg, Jerome M. and Menachem Levanoni. Jan. 1994. "ABC: A Better Control for Manufacturing." *IBM Journal of Research and Development*, v. 38, n. 1, pp. 11-30.

Leang, Sovarong, Shang-Yi Ma, John Thomson, Bart John Bombay, and Costas J. Spanos. May 1996. "A Control System for Photolithographic Sequences." *IEEE Transactions on Semiconductor Manufacturing*, vol. 9, No. 2.

Lee, Brian, Duane S. Boning, Winthrop Baylies, Noel Poduje, Pat Hester, Yong Xia, John Valley, Chris Koliopoulus, Dale Hetherington, Hong.liang Sun, and Michael Lacy. Apr. 2001. "Wafer Nanotopography Effects on CMP: Experimental Validation of Modeling Methods." San Francisco, California: Materials Research Society Spring Meeting.

Matsuyama, Akira and Jessi Niou. 1993. "A State-of-the-Art Automation System of an ASIC Wafer Fab in Japan." *IEEE/SEMI International Semiconductor Manufacturing Science Syposium*, pp. 42-47.

McIntosh, John. Mar. 1999. "Using CD-SEM Metrology in the Manufacture of Semiconductors (Abstract)." *JOM*, vol. 51, No. 3, pp. 38-39.

Meckl, P. H. and K. Umemoto. Apr. 2000. "Achieving Fast Motions by Using Shaped Reference Inputs [Semiconductor Manufacturing Machine] (Abstract)." *NEC Research and Development*, vol. 41, No. 2, pp. 232237.

Meckl, P. H. and K. Umemoto. Aug. 1999. "Achieving Fast Motions in Semiconductor Manufacturing Machinery (Abstract)." *Proceedings of the 1999 IEEE International Conference on Control Applications*, vol. 1, pp. 725-729. Kohala Coast, HI.

Moyne, J., V. Solakhian, A. Yershov, M. Anderson, and D. Mockler-Hebert. Apr.-May 2002. "Development and Deployment of a Multi-Component Advanced Epitaxy Tool (Abstract)." *2002 IEEE Advanced Semiconductor Manufacturing Conference and Workshop*, pp. 125-130.

Moyne, James R., Nauman Chaudhry, and Roland Telfeyan. 1995. "Adaptive Extensions to a Multi-Branch Run-to-Run Controller for Plasma Etching." *Journal of Vacuum Science and Technology*. Ann Arbor, Michigan: University of Michigan: Display Technology Manufacturing Center.

Moyne, James, and John Curry. Jun. 1998. "A Fully Automated Chemical-Mechanical Planarization Process." Santa Clara, California: VLSI Multilevel Interconnection (V-MIC) Conference.

Moyne, James, Roland Telfeyan, Arnon Hurwitz, and John Taylor. Aug. 1995. "A Process-Independent Run-to-Run Controller and its Application to Chemical-Mechanical Planarization." *SEMI/IEEE Advanced Semiconductor Manufacturing Conference and Workshop*. Ann Arbor, Michigan: The University of Michigan, Electrical Engineering & Computer Science Center for Display Technology & Manufacturing.

Moyne, James. Oct. 1999. "Advancements in CMP Proces Automation and Control." Hawaii: (Invited paper and presentation to) Third International Symposium on Chemical Mechanical Polishing in IC Device Manufacturing: 196th Meeting of the Electrochemical Society.

Mozumder, Purnendu K. and Gabriel G. Barna. Feb. 1994. "Statistical Feedback Control of a Plasma Etch Process." *IEEE Transactions on Semiconductor Manufacturing*, v. 7, n. 1, pp. 1-11.

Muller-Heinzerling, Thomas, Ulrich Neu, Hans Georg Nurnberg, and Wolfgang May. Mar. 1994. "Recipe-Controlled Operation of Batch Processes with Batch X." *ATP Automatisierungstechnische Praxis*, vol. 36, No. 3, pp. 43-51.

Mullins, J. A., W. J. Campbell, and A. D. Stock. Oct. 1997. "An Evaluation of Model Predictive Control in Run-to-Run Processing in Semiconductor Manufacturing (Abstract)." *Proceedings of the SPIE—The International Society for Optical Engineering Conference*, vol. 3213, pp. 182-189.

Nov. 1999. "How to Use EWMA to Achieve SPC and EPC Control." *International Symposium on NDT Contribution to the Infrastructure Safety Systems*, Tores, Brazil. <http://www.ndt.net/abstract/ndtiss99/data/35.htm>.

Oct. 1984. "Method to Characterize the Stability of a Step and Repeat Lithographic System." IBM Technical Disclosure Bulletin, pp. 2857-2860.

Oct. 4, 2002. International Search Report for PCT/US01/22833.

Oechsner, R., T. Tschaftary, S. Sommer, L. Pfitzner, H. Ryssel, H. Gerath, C. Baier, and M. Hafner. Sep. 2000. "Feed-forward Control for a Lithography/Etch Sequence (Abstract)." *Proceedings of the SPIE—The International Society for Optical Engineering Conference*, vol. 4182, pp. 31-39.

Ostanin, Yu.Ya. Oct. 1981. "Optimization of Thickness Inspection of Electrically Conductive Single-Layer Coatings with Laid-on Eddy-Current Transducers (Abstract)." Defektoskopiya, vol. 17, No. 10, pp. 45-52. Moscow, USSR.

Ouma, Dennis, Duane Boning, James Chung, Greg Shinn, Leif Olsen, and John Clark. 1998. "An Integrated Characterization and Modeling Methodology for CMP Dielectric Planarization." *Proceedings of the IEEE 1998 International Interconnect Technology Conference*, pp. 67-69.

Pan, J. Tony, Ping Li, Kapila Wijekoon, Stan Tsai, and Fritz Redeker. May 1999. "Copper CMP Integration and Time Dependent Pattern Effect." *IEEE 1999 International Interconnect Technology Conference*, pp. 164166.

Pilu, Maurizio. Sep. 2001. "Undoing Page Curl Distortion Using Applicable Surfaces." *IEEE International Conference on Image Processing*. Thessalonica, Greece.

Rampalli, Prasad, Arakere Ramesh, and Nimish Shah. 1991. CEPT—A Computer-Aided Manufacturing Application for Managing Equipment Reliability and Availability in the Semiconductor Industry. New York, New York: IEEE.

Ravid, Avi, Avner Sharon, Amit Weingarten, Vladimir Machavariani, and David Scheiner. 2000. "Copper CMP Planarity Control Using ITM." *IEEE/SEMI Advanced Semiconductor Manufacturing Conference*, pp. 437-443.

Reitman, E. A., D. J. Friedman, and E. R. Lory. Nov. 1997. "Pre-Production Results Demonstrating Multiple-System Models for Yield Analysis (Abstract)." *IEEE Transactions Semiconductor Manufacturing*, vol. 10, No. 4, pp. 469-481.

Ruegsegger, Steven, Aaron Wagner, James S. Freudenberg, and Dennis S. Grimard. Nov. 1999. "Feedforward Control for Reduced Run-to-Run Variation in Microelectronics Manufacturing." *IEEE Transactions on Semiconductor Manufacturing*, vol. 12, No. 4.

Sarfaty, Moshe, Arulkumar Shanmugasundram, Alexander Schwarm, Joseph Paik, Jimin Zhang, Rong Pan, Martin J. Seamons, Howard Li, Raymond Hung, and Suketu Parikh. Apr.-May 2002. "Advance Process Control Solutions for Semiconductor Manufacturing." *13th Annual IEEE/SEMI Advanced Semiconductor Manufacturing Conference. Advancing the Science and Technology of Semiconductor Manufacturing. ASMC 2002*, pp. 101-106. Boston, MA.

Scarr, J. M. and J. K. Zelisse. Apr. 1993. "New Topology for Thickness Monitoring Eddy Current Sensors (Abstract)." Proceedings of the 36th Annual Technical Conference, Dallas, Texas.

Schaper, C. D., M. M. Moslehi, K. C. Saraswat, and T. Kailath. Nov. 1994. "Modeling, Identification, and Control of Rapid Thermal Processing Systems (Abstract)." *Journal of the Electrochemical Society*, vol. 141, No. 11, pp. 3200-3209.

SEMI. [1986] 1996. "Standard for Definition and Measurement of Equipment Reliability, Availability, and Maintainability (RAM)." SEMI E10-96.

SEMI. 2000. "Provisional Specification for CIM Framework Scheduling Component." San Jose, California. SEMI E105-1000.

SEMI. Jul. 1998. *New Standard: Provisional Specification for CIM Framework Domain Architecture*. Mountain View, California: SEMI Standards. SEMI Draft Doc. 2817.

Shindo, Wataru, Eric H. Wang, Ram Akella, and Andrzej J. Strojwas. 1997. "Excursion Detection and Source Isolation in Defect Inspection and Classification." *2nd International Workshop on Statistical Metrology*, pp. 9093.

Smith, Stewart, Anthony J. Walton, Alan W. S. Ross, Georg K. H. Bodammer, and J. T. M. Stevenson. May 2002. "Evaluation of Sheet Resistance and Electrical Linewidth Measurement Techniques for Copper Damascene Interconnect." *IEEE Transactions on Semiconductor Manufacturing*, vol. 15, No. 2, pp. 214-222.

Smith, Taber and Duane Boning. 1996. "A Self-Tuning EWMA Controller Utilizing Artificial Neural Network Function Approximation Techniques." *IEEE/CPMT International Electronics Manufacturing Technology Symposium*, pp. 355-363.

Sonderman, Thomas. 2002. "APC as a Competitive Manufacturing Technology: *AMD's Vision for 300mm*." AEC/APC.

Spanos, C. J., S. Leang, S.-Y. Ma, J. Thomson, B. Bombay, and X. Niu. May 1995. "A Multistep Supervisory Controller for Photolithographic Operations (Abstract)." *Proceedings of the Symposium on Process Control, Diagnostics, and Modeling in Semiconductor Manufacturing*, pp. 3-17.

Stoddard, K., P. Crouch, M. Kozicki, and K. Tsakalis. Jun.-Jul. 1994. "Application of Feedforward and Feedback Control to Semiconductor Device Manufacturing (Abstract)." *Proceedings of 1994' American Control Conference—ACC '94*, vol. 1, pp. 892-896. Baltimore, Maryland.

Suzuki, Junichi and Yoshikazu Yamamoto. 1998. "Toward the Interoperable Software Design Models: Quartet of UML, XML, DOM and CORBA." Proceedings IEEE International Software Engineering Standards Symposium. pp. 1-10.

Takahashi, Shingo, Kaori Tai, Hiizu Ohtorii, Naoki Komai, Yuji Segawa, Hiroshi Horikoshi, Zenya Yasuda, Hiroshi Yamada, Masao Ishihara, and Takeshi Nogami. 2002. "Fragile Porous Low-k/Copper Integration by Using Electro-Chemical Polishing." *2002 Symposium on VLSI Technology Digest of Technical Papers*, pp. 3233.

Tan, K. K., H. F. Dou, and K. Z. Tang. May-Jun. 2001. "Precision Motion Control System for Ultra-Precision Semiconductor and Electronic Components Manufacturing (Abstract)." *51st Electronic Components and Technology Conference 2001. Proceedings*, pp. 1372-1379. Orlando, Florida.

Tao, K. M., R. L. Kosut, M. Ekblad, and G. Aral. Dec. 1994. "Feedforward Learning Applied to RTP of Semiconductor Wafers (Abstract)." *Proceedings of the 33rd IEEE Conference on Decision and Control*, vol. 1, pp. 67-72. Lake Buena Vista, Florida.

Telfeyan, Roland, James Moyne, Nauman Chaudhry, James Pugmire, Scott Shellman, Duane Boning, William Moyne, Arnon Hurwitz, and John Taylor. Oct. 1995. "A Multi-Level Approach to the Control of a Chemical-Mechanical Planarization Process." Minneapolis, Minnesota: 42" National Symposium of the American Vacuum Society.

Tobin, K. W., T. P. Karnowski, L. F. Arrowood, and F. Lakhani. Apr. 2001. "Field Test Results of an Automated Image Retrieval System (Abstract)." *Advanced Semiconductor Manufacturing Conference, 2001 IEEE/SEMI*, Munich, Germany.

Van Zant, Peter. 1997. *Microchip Fabrication: A Practical Guide to Semiconductor Processing*. Third Edition, pp. 472-478. New York, New York: McGraw-Hill.

Wang, LiRen and Hefin Rowlands. 2001. "A Novel NN-Fuzzy-SPC Feedback Control System." *8th IEEE International Conference on Emerging Technologies and Factory Automation*, pp. 417-423.

Yasuda, M., T. Osaka, and M. Ikeda. Dec. 1996. "Feedforward Control of a Vibration Isolation System for Disturbance Suppression (Abstract)." *Proceeding of the 35th IEEE Conference on Decision and Control*, vol. 2, pp. 1229-1233. Kobe, Japan.

Yeh, C. Eugene, John C. Cheng, and Kwan Wong. 1993. "Implementation Challenges of a Feedback Control System for Wafer Fabrication." *IEEE/CHMT International Electronics Manufacturing Technology Symposium*, pp. 438-442.

Zhe, Ning, J. R. Moyne, T. Smith, D. Boning, E. Del Castillo, Yeh Jinn-Yi, and Hurwitz. Nov. 1996. "A Comparative Analysis of Run-to-Run Control Algorithms in Semiconductor Manufacturing Industry (Abstract)." *IEEE/SEMI 1996 Advanced Semiconductor Manufacturing Conference Workshop*, pp. 375-381.

* cited by examiner

COPPER WIRING MODULE CONTROL

CROSS-REFERENCE TO RELATED APPLICATIONS

This application is a divisional application of and claims priority to U.S. application Ser. No. 10/393,531, filed on Mar. 21, 2003, which claims priority to U.S. Provisional Application 60/366,270, filed on Mar. 22, 2002, each of which are incorporated herein by reference.

FIELD OF THE INVENTION

The present invention relates generally to semiconductor wafer manufacturing systems and processes. More particularly, the present invention relates to techniques for optimizing semiconductor manufacturing processes at, for example, the fab, tool, and/or module levels using feedback and/or feedforward information. Even more particularly, the present invention relates to techniques for optimizing semiconductor manufacturing processes at, for example, a copper wiring module using feedback and/or feedforward information from the various tools within the module.

BACKGROUND

Present-day semiconductor wafer fabrication factories (or 'fabs') are extremely complex environments that require an extraordinary amount of coordination. A typical fab may consist of hundreds of wafer processing functional units. Examples of these functional units include modules, submodules, tools, cluster tools, chambers, and any other entities responsible for performing one or more of a variety of operations or processes on a semiconductor wafer. The subject of processing by these functional units includes semiconductor wafers, which may be processed into a wide variety of items such as logic (e.g., central processing units) or memory (e.g., DRAMs). Each tool in the fab is responsible for performing one or more operations or series of operations that result in the final product. After a tool performs its operation, the wafer may be forwarded to a downstream tool where additional operations or series of operations may be performed. Each tool may process wafers according to hundreds of distinct processes, with each having hundreds of individual steps. Ultimately, the sum of the operations performed by these tools (e.g., the functional units in the fab) on the wafer results in the final product or the final state of the wafer.

In typical situations, the tools may be grouped, either logically or physically, into modules (which constitute a higher level functional unit relative to the tools) to produce a module level product (e.g., a product at the module level). For example, a number of tools may be grouped together in a copper wiring module to produce intricate copper geometric circuit patterns on the substrate of a wafer. These modules may include, at one or more portions thereof, any number of tools such as, for example, electro chemical plating (ECP) tools, chemical mechanical polishing (CMP) tools, and other similar tools. In a typical processing scheme, wafers are initially moved into a chamber of the ECP tool where an electroplating or plating process takes place. The result of the plating process is the application of, for example, a thin layer of copper on the wafer substrate. From there, the wafer may be moved downstream to a CMP tool. The CMP tool polishes the wafer to remove any excess metallization (i.e., the plating or plated material). Afterwards, the wafer may be moved to the next tool in the module, which may include, for example, a barrier polishing or other similar tool. The end result or final product of the module includes the remaining copper material, which forms the desired copper geometric circuit pattern.

In addition to the above-described processes performed by the functional units on a wafer (e.g., the application and subsequent polishing of metallization by tools in a copper wiring module), a number of quality control operations may be implemented within the functional units to improve the overall quality of the fab. In typical situations, any number of wafer attributes or properties may be measured during or after processing by a functional unit. These measured properties may then be compared against the expected results or target parameters. If a measured property deviates too greatly from an expected result, a modification or adjustment may be made to the processing operation or procedure of the functional unit in an attempt to address the deficiency.

Thus, with the copper wiring module described above, after plating by an ECP tool, the thickness of a layer applied to a wafer may be measured to generate a thickness profile. If the plated layer is too thick, the ECP tool recipe may be modified to decrease a plating time (i.e., the amount of time plating material is applied to the wafer). In a similar manner, after polishing at a CMP tool, the thickness of the polished layer may be similarly measured. If the layer is too thick, the CMP tool recipe may be modified to increase a polishing time (i.e., the amount of time the wafer is polished). In this manner, the control processes of the individual functional units within a fab may be modified to increase effectiveness and efficiency.

To implement these quality control measures, conventional wafer manufacturing systems contemplate, for example, that an engineer may inspect the product of a process after each step and manually update the recipe of that particular functional unit to address any unsatisfactory results. These products are monitored by using, for example, sensors or metrology devices after each processing step. More particularly, a wafer may be physically removed from the processing line, where any number of wafer properties may be measured, and subsequently returned to the line. For example, in the copper wiring module described above, a wafer may be removed after processing from a chamber in an ECP tool to allow measuring of a copper thickness. From there, the measured properties (e.g., the copper thickness) may be compared against the expected results or target parameters. When a less than satisfactory property or condition is identified, a modification may be made to the functional unit recipe to address the deficiency.

While these techniques addressed some of the problems faced with certain types of individual functional units (e.g., situations where the results of processing by a lone tool have drifted outside an acceptable range), they failed to consider the dramatic impact a wafer property at one functional unit could have on the processing effectiveness of another functional unit. Instead of sharing information between the functional units (e.g., between the ECP and CMP tools of a copper wiring module), the conventional approach was to address each functional unit and each problem individually.

One reason for this approach was the limited connectivity capability of the functional units. For example, the ECP tools and CMP tools of a copper wiring module were not capable of communicating easily with each other. Other reasons stemmed from the inability of the metrology devices of those functional units to collect data at a wafer level basis.

As a result, these conventional quality control processes had no way of addressing a deficient property measured at one functional unit anywhere but at that functional unit. Similarly, these processes did not share or transfer information upstream, downstream, or between runs to optimize processing. Thus, information measured at a CMP tool was not fed back to an ECP tool for purposes of optimizing processing of the CMP tool. This led to situations where one deficiency or problem may have been compounded by the existence of other problems at other functional units. In some cases, the remedies to a problem at one functional unit produced a result that may have been satisfactory to the first functional unit, but resulted in a condition or deficiency that was impossible to resolve at a downstream functional unit. As an example, to address the problem of a thicker than desirable plated layer, an ECP tool might decrease a plating time. While this modification may have resulted in a satisfactory result at the ECP tool, it may have also left a layer so thin that downstream CMP tools could not adequately process the wafer.

In the above and other cases, processing at one functional unit may be more effective if information could be utilized at other functional units to produce results that increase the effectiveness of processing of the first functional unit. For example, a CMP tool may process wafers more effectively if it could forward optimal processing information to an ECP tool. In this manner, the CMP tool may instruct the ECP tool to, for example, decrease a plating thickness.

What is therefore needed is a technique for optimizing semiconductor wafer manufacturing processes within a copper wiring module. Specifically, what is needed is a technique that transfers information from one tool within the copper wiring module to another for purpose of optimizing a copper wiring module output property. What is also needed is a technique that allows information or data to be transmitted between copper wiring module tools and/or processing runs. As a result, a tool may direct or request another tool to produce a result that provides optimal processing conditions for the requesting tool.

SUMMARY

The present invention addresses the needs and the problems described above by using feedback and feedforward information to optimize manufacturing processes in a fab. For example, the invention may be implemented in a copper wiring module to optimize a copper wiring module output property such as a sheet resistance or an interconnect line resistance. Specifically, a first wafer property is initially measured during or after processing by a first process. One example of the first process includes an electro chemical plating process. Examples of the wafer properties that may be measured at the first process include thickness profile, edge exclusion information, sheet resistance profile, reflectance, resistivity drop, and reflectivity. Subsequently, the wafer is forwarded to a second process. An example of the second process includes a chemical mechanical polishing process. A second wafer property is then measured during or after processing by the second process. Examples of the wafer properties that may be measured at the second process include copper clearing time, reflectance, thickness, and an electrical property. Subsequently, at least one of these first and second wafer properties is used to optimize the second process. Specifically, one or more target parameters of a second process recipe are adjusted in a manner that obtains a desired final output property on the wafer (e.g., a sheet resistance or an interconnect line resistance) by using these first and second wafer properties.

In one or more parallel and at least somewhat overlapping embodiments, the second process (e.g., the CMP process) includes a bulk polish process, an endpoint process, and a barrier polish process. In these embodiments, information may be measured at any combination of these processes for optimization of the second process. Examples include thickness profile information collected during or after the bulk polish process, copper clearing information collected during or after the endpoint process, and/or electrical property information collected during or after the barrier polish process.

DESCRIPTION OF DRAWINGS

Various objects, features, and advantages of the present invention can be more fully appreciated as the same become better understood with reference to the following detailed description of the present invention when considered in connection with the accompanying drawings, in which.

DETAILED DESCRIPTION

In accordance with one or more embodiments of the present invention, feedback and feedforward information is measured, transmitted and utilized by a number of functional units to optimize manufacturing processes used in the production of semiconductor wafers. For example, a sheet resistance or an interconnect line resistance output property of a copper wiring module may be optimized using information measured at the various tools within the module. Specifically, a first wafer property is initially measured during or after processing by a first process. Subsequently, the wafer is forwarded to a second process. A second wafer property is then measured during or after processing by the second process. At least one of these first and second wafer properties are used to optimize the second process. Specifically, one or more target parameters of a second process recipe are adjusted in a manner that obtains a desired final output property on the wafer by using these first and second wafer properties.

Figure 1:
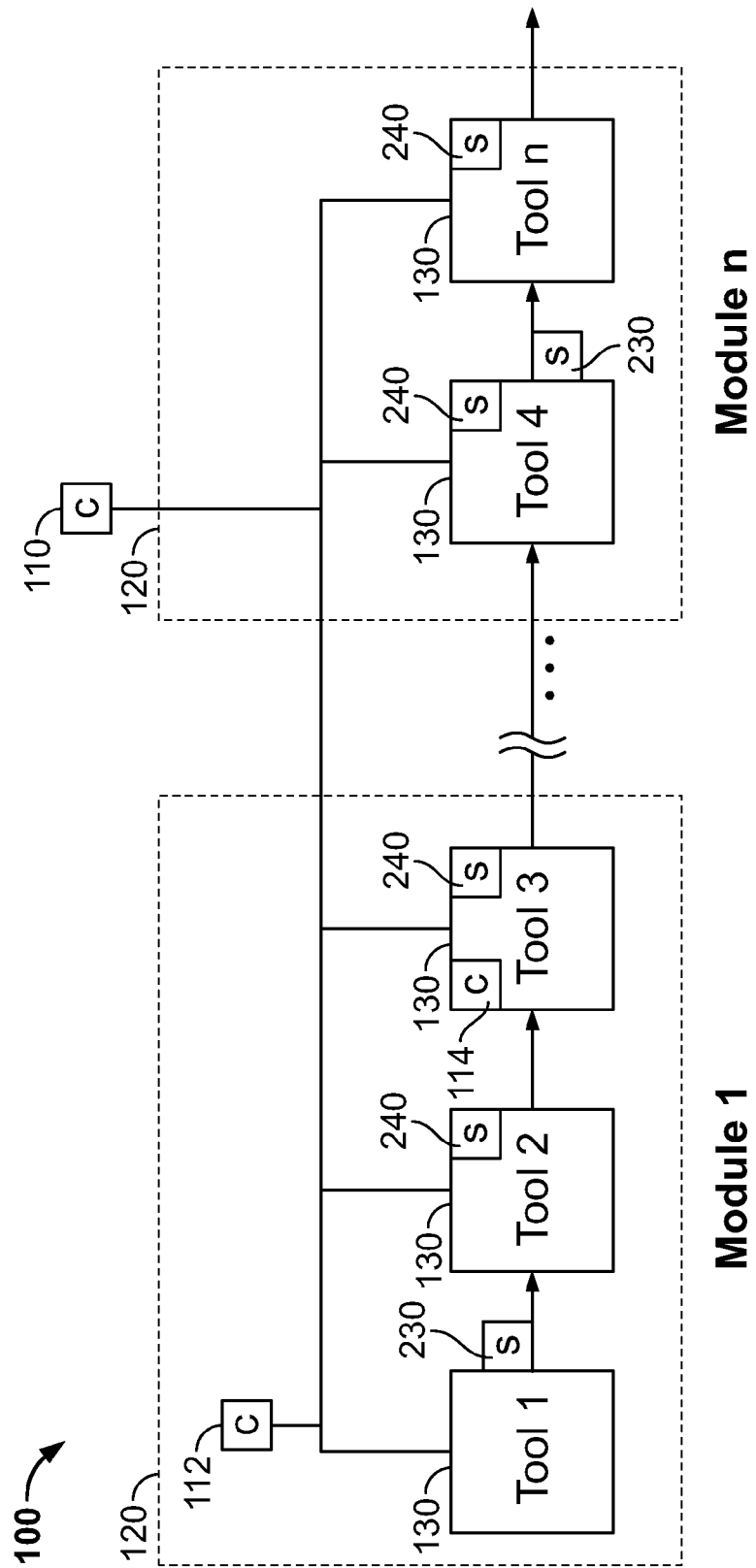
FIG. 1 depicts one example of a block diagram representation of a semiconductor manufacturing facility or fab utilizable for implementing one or more aspects of the present invention.

FIG. 1 depicts one example of a block diagram representation of a semiconductor manufacturing facility or fab 100 utilizable for implementing one or more aspects of the present invention. Fab 100 may be used to process semiconductor wafers to produce any number of semiconductor products, such as DRAMs, processors, etc. As shown in FIG. 1, fab 100 includes, among other components, any number of modules 120. Modules 120 individually process wafers to produce a module final product and operate in conjunction with each other to produce a fab final product. During operation, wafers are passed from one module to another where any number of operations may be performed. Examples of modules include copper wiring modules, physical vapor deposition (PVD) modules, dep-etch modules, and the like.

Each module includes, among other components, any number of tools 130. In a manner analogous to the above, tools 130 individually process wafers to produce a tool final product and operate in conjunction with each other to produce a module final product. Thus, similar to the module level, wafers are passed from one tool to another where any number of operations may be performed, the ultimate goal of which is to arrive at the module final product. In one or more embodiments of the present invention, at least some of the tools can be "cluster tools" (or the like) capable of performing multiple functions. Examples of tools include electro chemical plating (ECP), chemical mechanical polishing (CMP), chemical vapor deposition, etching, copper barrier seed, barrier polishing tools, and the like.

Figure 2:
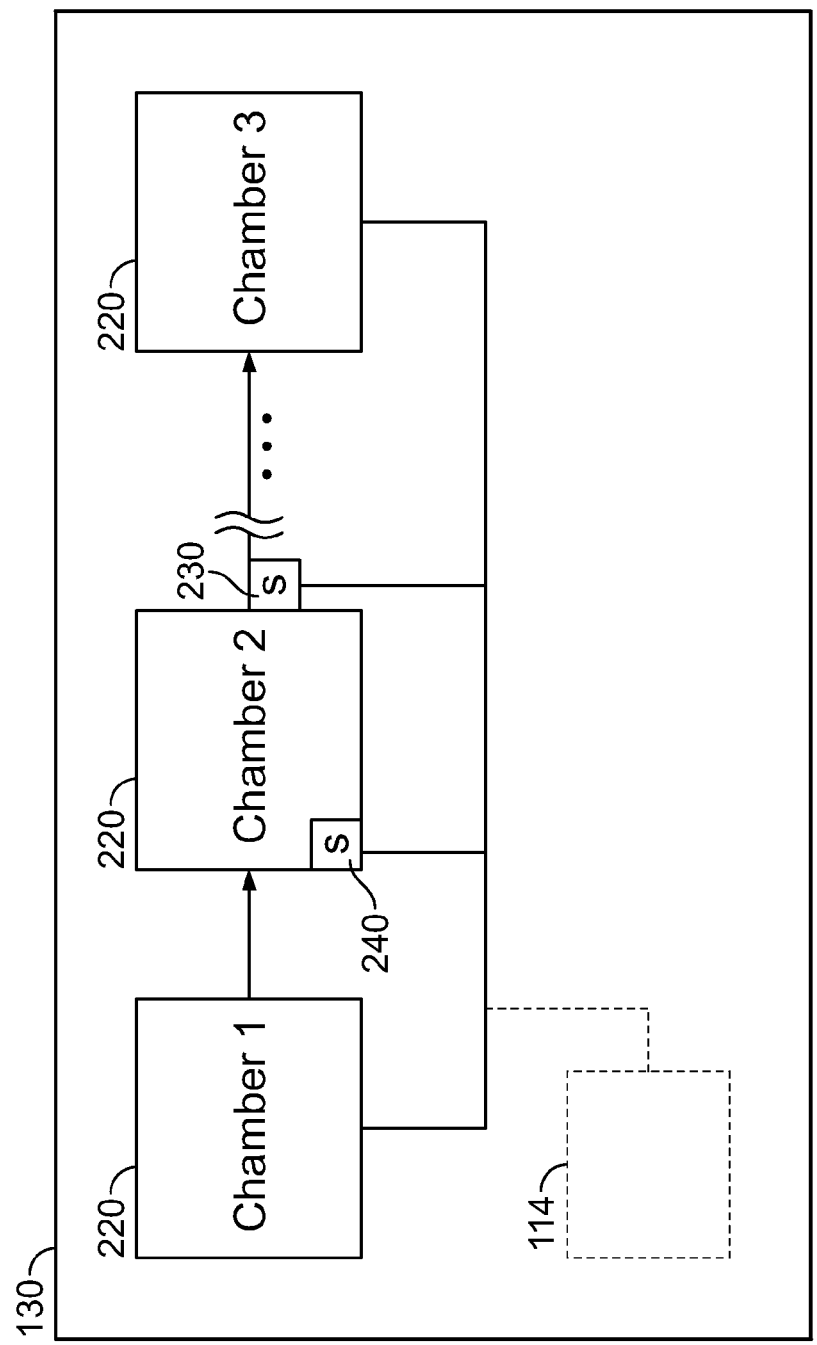
FIG. 2 depicts one example of a block diagram representation of a semiconductor manufacturing tool utilizable for producing a tool product in the fab of FIG. 1.

FIG. 2 depicts one example of a block diagram representation of a semiconductor manufacturing tool utilizable for producing a tool product in the fab of FIG. 1. Tool 130 includes any number of processing chambers 220. Each chamber may be responsible for performing a process or series of processes on a wafer. The sum total of these processes results in a tool final product. As an example, an ECP tool may include an electroplating or plating chamber, a material removal chamber, and a clearing chamber. In these examples, the plating chamber is responsible for applying a thin layer of plating material (i.e., metallization) onto a wafer substrate. From there, the wafer may be moved to the next chamber, in this case, the removal chamber, where any excess material may be removed. Processing continues in this manner, with the wafer being advanced from one chamber to another, until the desired final product has been produced. In conjunction with the processing that occurs in the ECP chambers, any number of metrology devices may be implemented to measure wafer property information (e.g., during or after processing in a chamber). Examples of wafer property information that may be collected include thickness profile information, edge exclusion data, copper film thickness, sheet resistance profile, reflectance, resistivity drop, reflectivity, etc.

As another example, chambers 220 in FIG. 2 may correspond to the platens in a CMP tool. In this example, a first platen (i.e., Chamber 1) may represent, for example, a bulk polish platen. The bulk polish platen may be utilized to remove relatively large amounts of plating material. In conjunction with bulk polishing, a metrology device may be implemented to measure wafer property information such as, for example, plating thickness, etc. Continuing with this example, the second platen (i.e., Chamber 2) may represent a copper clearing or endpoint platen. This platen performs a slower polishing step, and may be utilized to terminate the polishing process at an endpoint. In conjunction with this polishing process, a metrology device may be implemented to measure wafer property information, such as, for example, a copper clearing profile, reflectance, thickness uniformity, etc. The third platen (i.e., Chamber 3) may represent a barrier polish platen. Like the preceding platens, a metrology device may be implemented to measure wafer property information, such as, for example, electrical properties, sheet resistance, line resistance, leakage, capacitance, yield, deflectivity, etc. A commercial embodiment of a CMP apparatus could be, for example, any of a number of processing stations or devices offered by Applied Materials, Inc. of Santa Clara, Calif. including, for example, the Mirra Mesa™ CMP device.

The above described fabs, modules, tools, and chambers constitute examples of the different functional units within a typical wafer manufacturing facility.

Referring to FIGS. 1 and 2, and as will be discussed in greater detail below, in one or more embodiments of the present invention, any number of controllers may be implemented within the fab for overseeing operation of the various functional units. For example, controller 110 (FIG. 1) may be implemented at the fab level for controlling high-level operations of the entire fab. In a similar manner, lower level controllers, such as module level controller 112 (FIG. 1) and tool level controller 114 (FIG. 2) may be implemented at the module and tool levels for controlling processing by those functional units. In addition, controllers may also be implemented to control multiple functional units and functional units at distinct levels. One example of a tool controller includes iAPC offered by Applied Materials, Inc. of Santa Clara, Calif.

In addition to the controllers, any number of sensors or metrology devices may be implemented within the fab to operate in conjunction with the controllers for, e.g., quality control purposes. These metrology tools may be implemented as integrated or insitu sensors 240 within the functional units themselves or as inline sensors 230 outside of the functional units. As will be discussed in greater detail below, these sensors are implemented to collect wafer or metrology data, including, for example, any number of wafer properties, during or after processing by the functional units. In accordance with one or more embodiments of the present invention, this data may then be transmitted back to the instant processing functional unit, or other upstream or downstream functional units, and utilized to optimize processing procedures. Examples of such metrology tools include the RS-75™ offered by KLA-Tencor of San Jose, Calif. Examples of wafer properties that may be collected and transmitted include thickness, clearing time, reflectivity, etc.

As mentioned above, the controllers are responsible for directing the operation of the functional units (e.g., the fab, modules, or tools). The controllers may be stand-alone computing units or integrated within one or more of the functional units. As will be described below, based on a desired or target product (as defined by any number of target parameters) a controller may direct any number of functional units to perform the tasks or operations required to obtain those desired targets.

Generally speaking, each controller utilizes any number of models to attain these targets by determining the operations necessary to produce an output or product that has properties which fall within an acceptable range of the targets. Thus, the models determine and/or optimize the processes or operations required to produce an output that is within an acceptable range of the target. As will be discussed below, these operations are included with a recipe of the functional unit. As known to those of ordinary skill in the art, the models are typically created through physical understanding, experimentation, and/or previous observation. Models may exist at any of the fab, module or tool levels. For example, the model for a functional unit may be implemented in an associated controller. Thus, a fab-wide model may be implemented in fab controller 110. Each model is responsible for determining the specifics of the processes believed to be necessary to achieve the desired target parameter.

In accordance with one or more embodiments of the present invention, these models receive as inputs, for example, incoming wafer properties (e.g., an incoming thickness), material characteristics (e.g., properties of a substrate), the target parameters (e.g., a desired thickness), feedback from previous runs or the runs of other functional units, and any number of other inputs or information. In this regard, information or data passed from an upstream functional unit may be termed feedforward data. Likewise, information from a previous run (in the same functional unit) or in a downstream functional unit may be termed feedback data. Using this information, the models subsequently determine or identify the processes or operations believed to be necessary to achieve the desired targets.

In accordance with one or more embodiments of the present invention, recipes are generated by these models for obtaining the wafer properties required to achieve or obtain the desired final product. These recipes constitute a set of predefined process parameters believed to be required to effectuate a functional unit processing outcome. For example, a typical tool recipe may dictate one or more setpoints for any number of processes required to effect a desired tool output. Thus, a recipe may identify the required temperature, pressure, power, processing time, lift position, and flow rate of a material needed to produce a particular target wafer result. Examples of these results include film thickness, uniformity profiles, via depth, trench depth, sheet resistance, uniformity of the copper patterns, etc. An example of a technique utilizable for generating recipes is described in U.S. patent application Ser. No. 09/998,372, filed on Nov. 30, 2001, assigned to Applied Materials, Inc., of Santa Clara, Calif., which is incorporated herein by reference.

Figure 3:
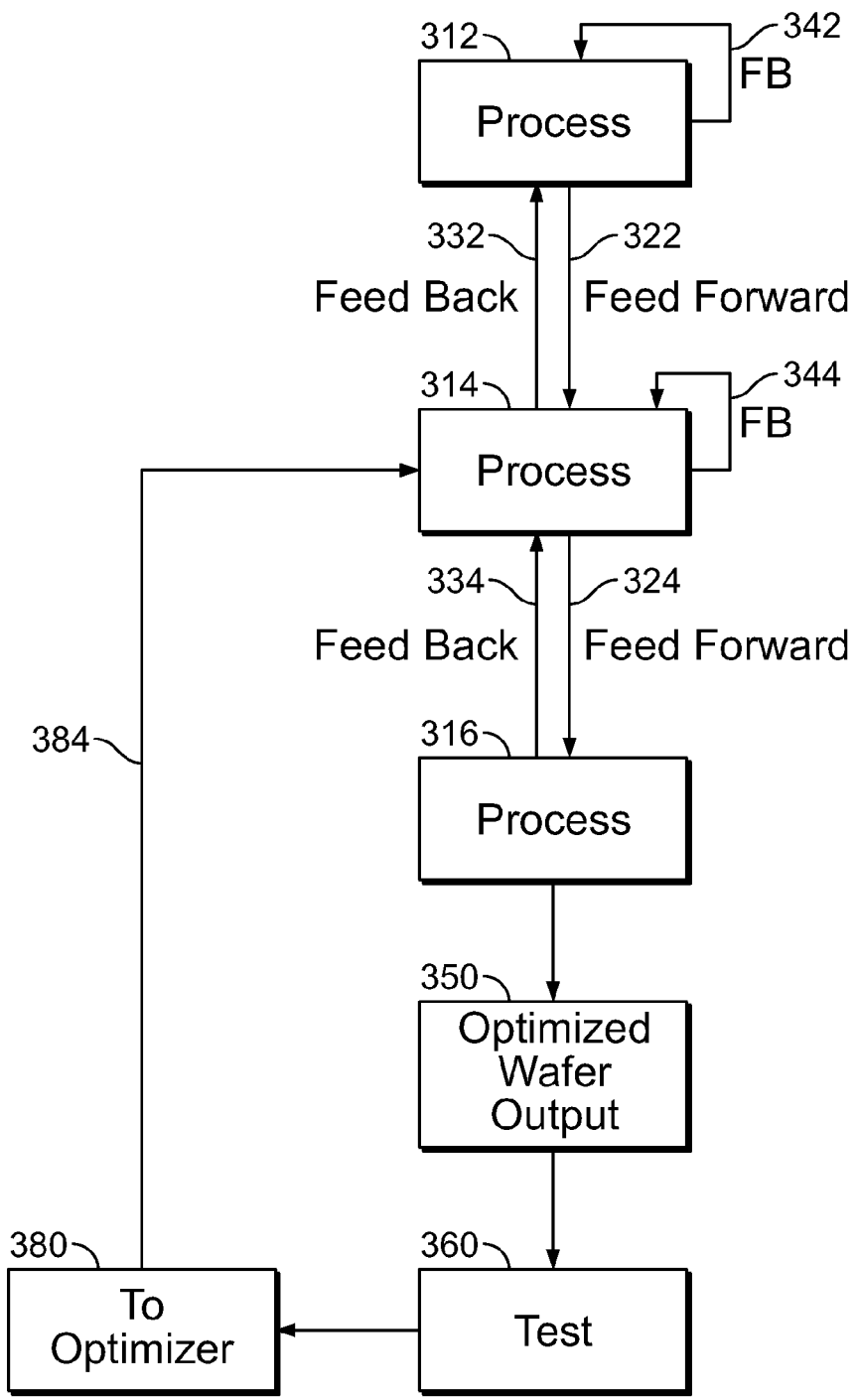
FIG. 3 depicts one example of a process implementable for using feedback and feedforward information to optimize functional unit processing.

Referring now to FIG. 3, a high level process utilizable for implementing at least some optimizing techniques contemplated by one or more embodiments of the present invention is depicted. As shown in FIG. 3, a number of processes 312, 314, 316 are implemented in a module or other functional unit grouping. Processes 312, 314, 316 represent the processes or series of processes that are performed on a wafer to result in a final product. For example, processes 312, 314, 316 may correspond to the chambers in an individual tool or to the tools within a submodule or module. Thus, in the case of a copper wiring module, processes 312, 314, 316 may represent ECP, CMP and barrier polishing processes, respectively. Additionally, some other examples of plating processes contemplated by one or more embodiments of the present invention include electroless plating, physical vapor deposition plating, and other similar plating processes. Similarly, other examples of polishing processes contemplated by one or more embodiments of the present invention include electropolishing techniques and other similar processes.

As mentioned above, wafers are passed from one process to another where any number of operations may be performed by, for example, individual tools or modules, as dictated by their recipes. Thus, in the above copper wiring module example, a wafer may initially be moved into ECP tool 312, where a plating layer may be applied to a wafer substrate. From there, the wafer may be advanced to the next tool where subsequent operations may be performed. In this example, after processing has been completed at ECP tool 312, the wafer is advanced to CMP tool 314, where wafer polishing takes place. After polishing, the wafer may be transferred to subsequent downstream tools 316, where additional processing may occur.

In accordance with one or more embodiments of the present invention, at each processing step (i.e., at each of processes 312, 314, 316), any number of wafer properties may be collected by metrology tools 230, 240 (see, FIG. 1 or FIG. 2). These properties may be collected in real-time during processing by, for example, insitu sensors 240, or immediately after processing by, for example, inline sensors 230. In accordance with one or more embodiments of the present invention, these properties may be forwarded to downstream functional units 322, 324; upstream functional units 332, 334; or back to the instant functional units 342, 344 to optimize processing operations.

In addition to this metrology data, other information may also be transferred to the functional units. For example, incoming wafer properties, functional unit state conditions, substrate material characteristic information, and other similar information may be transferred for use in optimizing processing. More specifically, these properties may be forwarded to each of the functional unit controllers where they may be inputted into the functional unit models. As discussed above, using these inputs (e.g., the actual measured wafer properties and any additional information) the models generate or modify the recipes in a manner that leads to optimal outputs or results.

In accordance with one or more embodiments of the present invention, each functional unit may forward information or processing requests to upstream functional units that may be used to optimize their own results. In particular, a functional unit may inform or direct another functional unit to attempt to attain a particular target parameter that optimizes its own processing. Thus, a CMP tool may direct an upstream tool (e.g., an ECP tool) to produce a thickness that assists the CMP tool in attaining its final tool product. A simple example includes a large thickness at the CMP tool that requires a longer than optimal CMP polish time. In this situation, the CMP tool may optimize its processing by forwarding a request to the ECP tool for a thinner plated layer. If possible, the ECP tool model responds by modifying the ECP tool recipe to attain a thinner layer target parameter. For example, the ECP tool model identifies any processes that may be adjusted to attain these target parameters (e.g., a plating process) and makes appropriate modifications (e.g., decreasing the plating time).

After processing, the optimized wafer or product 350 (i.e., the wafer produced using the above-described optimizing techniques) may be tested 360. The results of these tests may be passed to an optimizer 380, where additional modifications to a process may be made (STEP 384).

The above techniques may be used to address unforeseeable relationships between the properties as well. In accordance with one or more embodiments of the present invention, the edge exclusion of the bevel cleaner in the ECP process (discussed below) plays a significant role in the removal rate behavior at the CMP process. As a result, edge exclusion parameters may be measured and adjusted at ECP processes to optimize or obtain better overall module results at CMP processes.

More specifically, the area of a plated layer at or near the edge of the substrate (i.e., the perimeter of the substrate) is known as the "bevel". A number of problems occur at the bevel of the substrate. For example, because of higher current densities, the bevel tends to have a higher rate of deposition than at other areas of the substrate. Contact points present at or near the edge of the substrate may break after plating leading to irregularities at the edge. Thus, a multiple step bevel cleaning process (i.e., a bevel cleaner) is used to remove the bevel. This bevel cleaning process involves applying an etchant to the bevel region to remove metal near the substrate edge. Specifically, the metallization (i.e., the plated material) is removed from the substrate at a certain distance from the substrate edge. The etchant is then removed from the substrate through rinsing with deionized water. Lastly, the substrate is dried by spinning the substrate. The amount of material removed from the substrate constitutes the edge exclusion property of the wafer.

In accordance with one or more embodiments of the present invention, this edge exclusion property may be fed forward from an ECP tool to a CMP tool to optimize module processing. For example, larger edge exclusions on a substrate allow shorter relative polishing time at the edges during CMP processing. As a result, the edge exclusion may be controlled at an ECP process to obtain a result that leads to optimal processing at a CMP tool. In a similar manner, CMP polishing may be adjusted to account for edge exclusion. Thus, in these situations, edge exclusion data may be measured at or after an ECP process and fed forward to a downstream process (e.g., a CMP process) and used in optimization of the downstream process. Likewise, the edge exclusion parameter at an upstream ECP process may be adjusted in response to a downstream request or problem.

Figure 4:
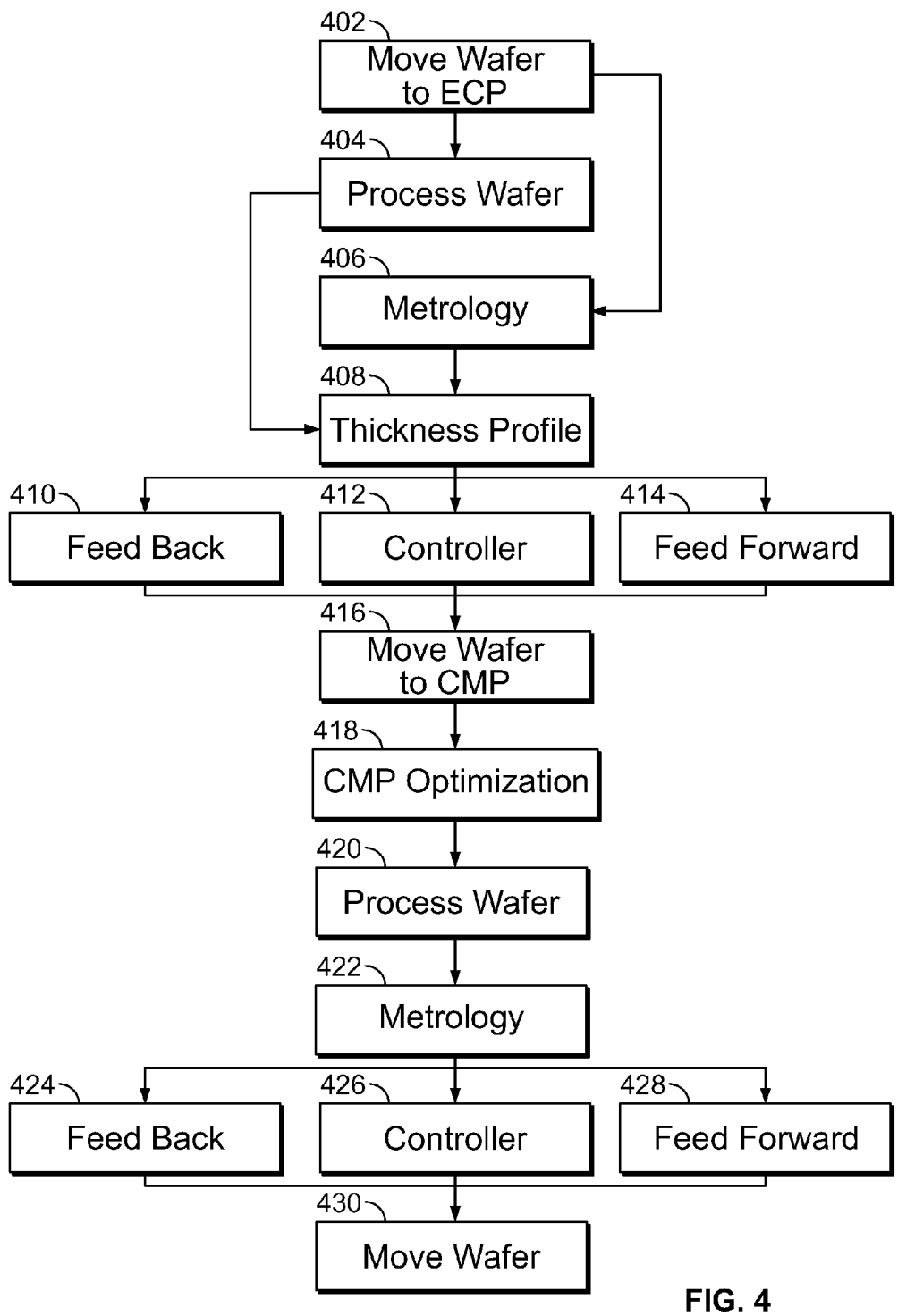
FIG. 4 depicts one example of a flow diagram of a process sequence for optimizing functional unit processing of one or more of the embodiments of the present invention.

FIG. 4 depicts one example of a flow diagram of a process sequence for optimizing functional unit processing of one or more embodiments of the present invention. Although the example shown in FIG. 4 depicts processing in a copper wiring module, it is to be understood that the process illustrated therein may be implemented in any functional unit. For example, the process may just as easily be implemented in a PVD module, the chambers in an electroplating tool, between a number of modules, etc.

Initially, processing commences with the delivery of a substrate or wafer to an ECP tool (STEP 402). Specifically, a substrate handler, such as a robot, may be used to deliver the substrate to a first chamber of the ECP tool (e.g., an electroplating chamber). Once the substrate is positioned in the tool chamber, the ECP tool processes the wafer (STEP 404) as directed by the ECP tool recipe. In this example, the ECP tool applies a plating layer onto the substrate.

During (or after) the processing operations (e.g., STEP 404), a metrology tool may be utilized to measure any number of wafer properties of the substrate (STEP 406). For example, any of an insitu or inline sensor may be used to measure the wafer properties. With insitu sensors, the properties may be measured in real time during processing. With inline sensors, the properties may be measured immediately after processing by the tool. In the case of an ECP tool plating process, the metrology devices may collect thickness data, edge exclusion information, etc. More specifically, the thickness of a plated layer may be measured from any number of positions on the wafer. In one or more embodiments, the thickness may be measured at any number of key points, including for example, any number of inflection points on the wafer.

Upon completion of a process, the substrate may be moved or transferred to a subsequent chamber within the tool, where any number of additional processes may be performed. For example, a rinsing process may take place in a downstream chamber to remove an edge bead of the bevel. Alternatively, additional processes may be performed in a single chamber (i.e., the plating and rinsing processes may occur in the same chamber). Whatever the case, any number of metrology processes may occur at any time for the collection of additional wafer property data. For instance, as discussed above, the metrology devices may collect edge exclusion data corresponding to the substrates.

Once the metrology data has been collected, any additional processing required to transform the data into useable information may take place (STEP 408). For example, in the case of thickness data, the thickness measured at numerous positions on a wafer may be utilized to generate a thickness profile.

In accordance with one or more embodiments of the present invention, the metrology data may be forwarded to any number of functional units for optimizing processing at, for example, those functional units or at the transmitting functional unit. As one example, the metrology data may be fed backwards to an upstream functional unit (STEP 410). Similarly, the data may be fed forward to a downstream functional unit (STEP 414). In addition, the data may be fed back to the measuring functional unit for use in optimizing subsequent runs. Referring back to the above-described copper wiring module, after completion of processing at an ECP tool, the metrology data may be forwarded to a CMP tool. The metrology data may also be fed to a controller (STEP 412) for optimizing, for example, operations at a higher functional level. Likewise, the data may be fed back to the ECP tool to improve processing during subsequent ECP runs.

Once processing has been completed at a particular functional unit, the wafer or substrate may be transferred to a downstream function unit (STEP 416). In this example, the substrate may be moved or forwarded to a chamber in a CMP tool.

In accordance with one or more embodiments of the present invention, before processing takes place at the downstream functional unit, the downstream functional unit processes may be optimized utilizing, for example, the above described metrology data (STEP 418). For instance, forwarded metrology data from an upstream functional unit may be inputted into a model by a controller for adjusting the functional unit recipe to obtain optimized processing results. In addition, the information received is not limited to information from upstream functional units. As mentioned above, the controller may receive data from downstream functional units and/or information from previous runs. In this manner, information may be shared between functional units and/or processing runs to optimize processing.

As an example, the CMP controller may receive an indication from a downstream tool that the thickness of the wafer is thinner than optimal. In this case, the CMP recipe may be adjusted to decrease a polishing pressure. As another example, a CMP controller may receive a thickness profile from an upstream ECP tool. If the thickness at the center of the substrate is greater than expected, the CMP recipe may be adjusted to increase a polishing pressure at the center of the wafer. As yet another example, feedback from a previous run at the CMP tool may indicate that a wafer thickness is greater than expected after polishing. This condition may indicate, for example, that the polishing pads of the CMP tool have worn out. In this case, the CMP recipe may be adjusted to increase polishing time to account for the wear of the pads.

After optimization, the wafers are processed according to the optimized recipes (STEP 420). For example, the CMP tool polishes the wafer according to the recipe adjusted in the manner described above. Subsequently, a metrology tool may be utilized to measure any number of wafer properties of the substrate (STEP 422) during or after processing by the CMP tool. Examples include copper clearing time, reflectance, thickness, electrical properties, etc. As with the ECP tools, any of an insitu or inline sensor may be used to measure the wafer properties.

After the metrology data has been collected, the substrate may be transferred to other chambers within the CMP tool, where any number of additional processes may be performed. For example, the substrate may be transferred from a bulk polishing platen to an endpoint platen, or from an endpoint platen to a barrier polish platen. Alternatively, additional processes may be executed in the current chamber. Like with the above, any number of metrology processes may occur at this point for the collection of additional wafer property data for optimizing other or subsequent processes.

In accordance with one or more embodiments of the present invention, the metrology data from the CMP tool may be forwarded to any number of functional units for optimizing downstream, upstream or subsequent operation processing. In particular, the metrology data may be fed backwards to an upstream functional unit including, for example, the ECP tool (STEP 424). Similarly, the data may be fed forward to a downstream functional unit (STEP 428), such as, for example, a barrier polishing tool. Additionally, the metrology data may be fed to a controller (STEP 426) for optimizing, for example, operations at a higher functional level. Also, the data may be fed back to the measuring functional unit to improve processing during subsequent runs.

Once processing has been completed at the CMP tool, the wafer or substrate may be transferred to a downstream functional unit (STEP 430). In this example, the substrate may be moved or forwarded to a chamber in a barrier polishing tool.

Referring to FIGS. 4 and 2, a polishing procedure occurring at the CMP tool illustrates in greater detail one or more embodiments of the present invention. In this example, an output property of the CMP tool is optimized by controlling a number of CMP and/or ECP process steps, according to wafer property metrology data collected by the CMP and/or ECP tools. Examples of the output property that may be optimized include a sheet resistance distribution uniformity and interconnect line resistance, etc.

After processing at the ECP tool has been completed, the wafer or substrate may be delivered to a bulk polishing platen (see, e.g., STEP 416 in FIG. 4 and Chamber 1 in FIG. 2) of a CMP tool. At the bulk polishing platen, relatively large amounts of plated material (e.g., copper metallization applied at the ECP tool in STEP 404) may be removed. During or immediately after polishing, a metrology device may be used to measure metrology data or wafer property information. In this example, an inline sensor may be used to gather thickness data. From there, the wafer may be transferred to a copper clearing platen (see, e.g., Chamber 2 in FIG. 2) where additional plated material may be removed. Like with the first platen, a variety of metrology data may be collected at the second platen. In this example the data may include thickness uniformity as determined by a reflectance value measured in any number of zones on the wafer. Finally, the wafer may be transferred to a third platen (e.g., the barrier polish platen [i.e., Chamber 3 in FIG. 2]), where additional processing and metrology collection may take place. Examples of wafer property information that may be collected at the third platen include electrical parameters such as line resistance, leakage, etc.

In accordance with one or more embodiments of the present invention, the metrology data measured at any combination of the three platens may be transmitted to, for example, a module controller (e.g., controller 114 in FIG. 2). Subsequently, the controller modifies or optimizes the recipes used to control processing of the individual platens. As an example, the controller may modify any of the target parameters of the bulk polish platen, including, for example, pressure, speed, etc., according to the forwarded metrology data.

In addition, data from prior processes may also be utilized in the optimization. For instance, information from, for example, downstream etch or dielectric deposition functional units may be utilized to optimize CMP polishing processes. Specific examples of information that may be forwarded includes dielectric deposition thickness and uniformity, critical dimensions such as line depth and width after an etch process, trench depth value, uniformity after an etch process, etc.

Figure 5:
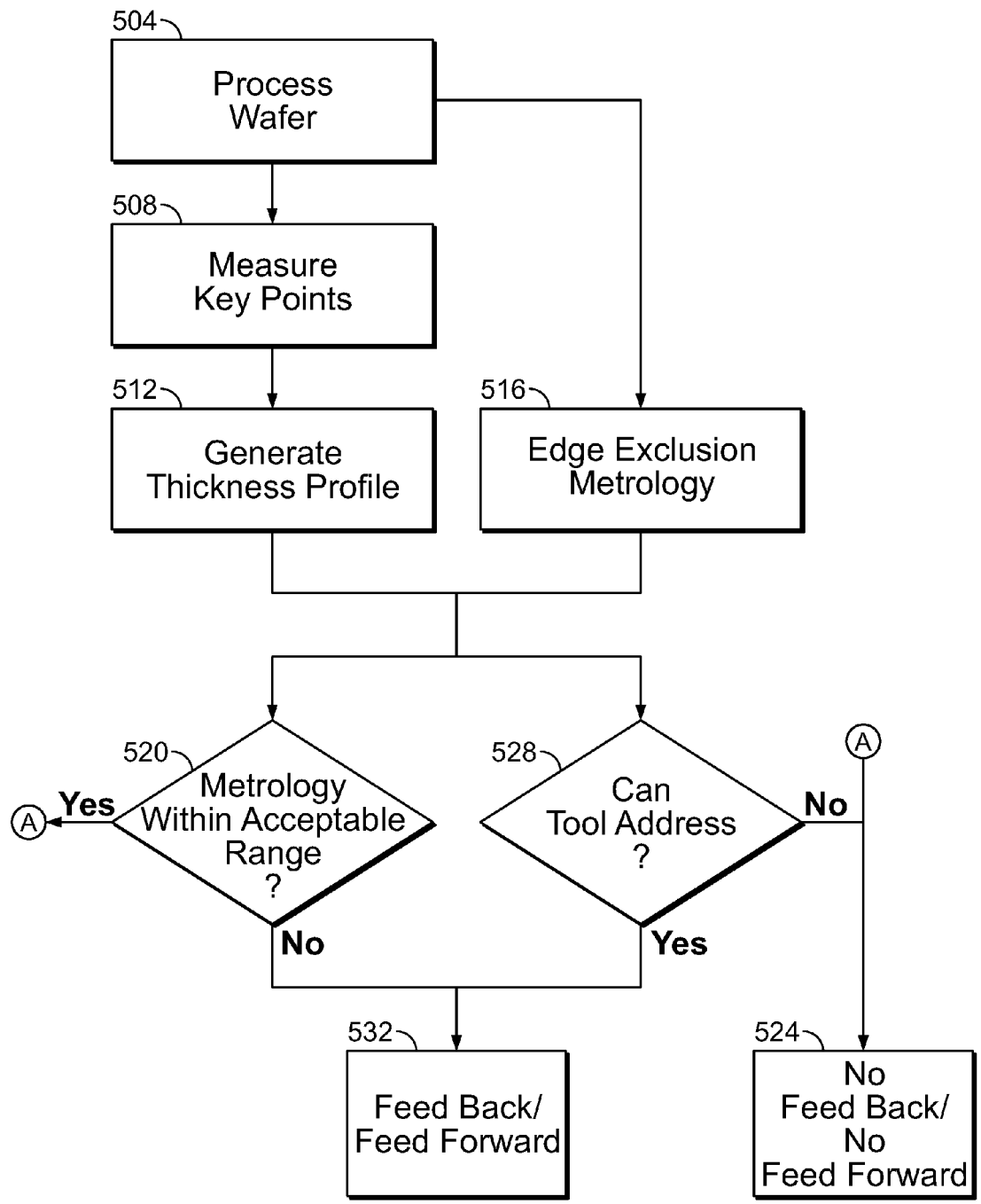
FIG. 5 depicts one example of a process utilizable for forwarding feedback and/or feedforward information.

Referring now to FIG. 5, one example of a process utilizable for controlling the forwarding of feedback and/or feedforward information is depicted. Although the example shown in FIG. 5 depicts processing in the ECP tool of a copper wiring module, it is to be understood that at least one or more embodiments of the process illustrated therein may be implemented in any functional unit.

To start, the ECP tool processes a wafer according to a tool recipe as described above (STEP 504). For example, a layer may be applied onto the substrate. During (or immediately after) processing, any number of metrology tools may be utilized to collect metrology data (i.e., wafer properties) from the wafer. For instance, the thickness of the plated layer may be measured at a number of key points (STEP 508). After measuring the metrology data, any necessary data transformations or processing may occur (STEP 512). For example, a thickness profile may be generated using the thickness measured at each of the above mentioned key points. In addition to thickness, other metrology data may also be measured. In particular, edge exclusion data may also be measured at this time (STEP 516).

For each set of measured or generated metrology data, a determination may be made to determine whether the metrology data should be forwarded to other functional units or to the measuring functional unit. A number of methods exist for determining whether data should be forwarded. In some cases, the data may be forwarded only if the measured property is not within a range of acceptable limits (STEP 520). Using thickness as an example, after comparing the measured properties against expected results, the metrology data may be automatically forwarded (to predetermined functional units) if the difference in thickness is greater than an acceptable level (STEP 532). These conditions indicate, for example, that a deficiency exists, which must be addressed. On the other hand, if the thickness is within an acceptable range, no information is forwarded (STEP 524). These conditions indicate, for example, that no modifications are necessary.

Another alternative (and possibly parallel) method that may be used to determine whether metrology data should be forwarded focuses on the capabilities of the receiving functional unit (STEP 528). In these cases, the metrology data is forwarded only if the other functional unit (i.e., the recipient of the metrology data) is capable of adequately addressing the deficiency (STEP 532). On the other hand, the metrology data is not forwarded if the other functional unit (i.e., the recipient of the metrology data) is not capable of adequately addressing the deficiency (STEP 524). Thus, in this methodology, metrology data is only forwarded if it is possible to remedy the deficiency.

Figure 6:
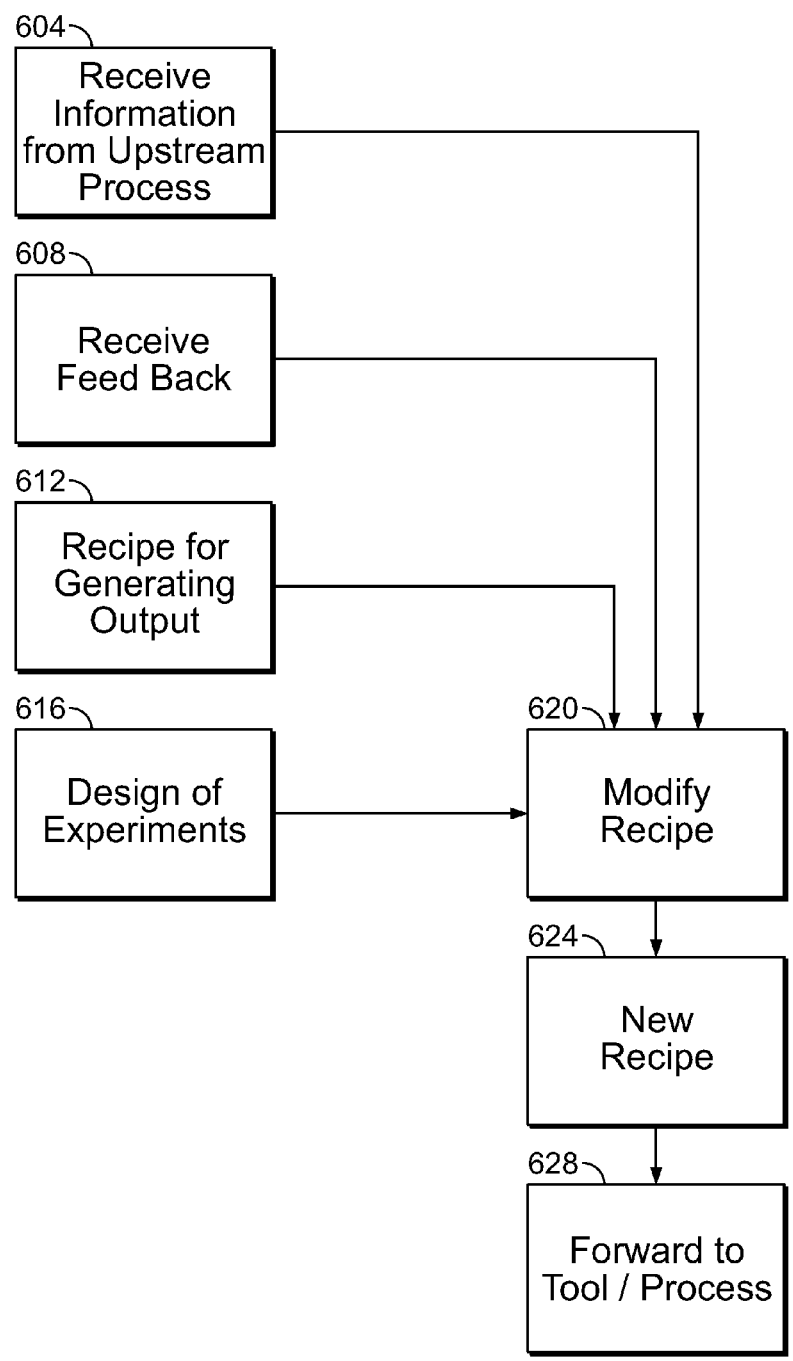
FIG. 6 depicts one example of a flow diagram of a process sequence for receiving and utilizing feedforward and feedback information to modify and/or generate functional unit recipes.

Referring now to FIG. 6, one example of a flow diagram of a process sequence for receiving and utilizing feedforward and feedback information to modify and/or generate functional unit recipes is depicted. Initially, any input information to be utilized in modifying the recipes is received (STEP 604). As an example, and as discussed above, metrology information may be forwarded to a functional unit if that unit is capable of adequately addressing a deficiency or if measured data falls outside an acceptable target range (see, e.g., FIG. 5). The information may include feedforward information from an upstream functional unit (STEP 604). Similarly, the information may include feedback information from a downstream functional unit or from a previous run at the instant functional unit (STEP 608).

In accordance with one or more embodiments of the present invention, the input information may include any data that impacts processing of the instant functional unit. In these situations, the data may be used in modifying processes of the instant unit to ultimately optimize processing of that unit. Similarly, the input information may include any data that impacts processing of, for example, another functional unit (e.g., a downstream or upstream functional unit). In these situations, the data may be used in modifying processes of the instant unit to ultimately optimize processing of the other unit.

As an example, the information may include thickness information from a plating process that may result in the alteration of bulk and fine polishing times at a downstream polishing process. For instance, a thicker than expected thickness profile may result in a longer bulk polishing step at the polishing unit. As another example, the information may include a request from the polishing process to apply less plating material. In this case, exceedingly long bulk polish times may result in a request to the plating process for a reduction in plating time.

In accordance with one or more embodiments of the present invention, the input information is utilized to modify a functional unit recipe to optimize processing. Thus, the functional unit recipe is examined (STEP 612) and modified (STEP 620) in view of, for example, design of experiments (DOE) information and other similar data (STEP 616). Generally speaking, experiments derived from DOE based techniques may be used to modify or construct the functional unit recipes. DOE based techniques refer to a methodology where a set of experiments are determined to optimally provide information for developing a model or specific correlation structure. Thus, the models may be generated based on, for example, experimentation, previous observation, or knowledge of the desired results. The models then may be use to generate or alter the recipes. Based on the input information and the desired resulting outputs, and the relationships therebetween (as defined by the models relating the inputs to the outputs), the operations and processes required to obtain the final products may be determined.

In accordance with one or more embodiments of the present invention, this modification step results in a new recipe (STEP 624), which ideally optimizes the process of a functional unit. The recipe may then be forwarded or implemented at the corresponding functional unit (STEP 628), where it may be utilized to produce optimized outputs.

Figure 7:
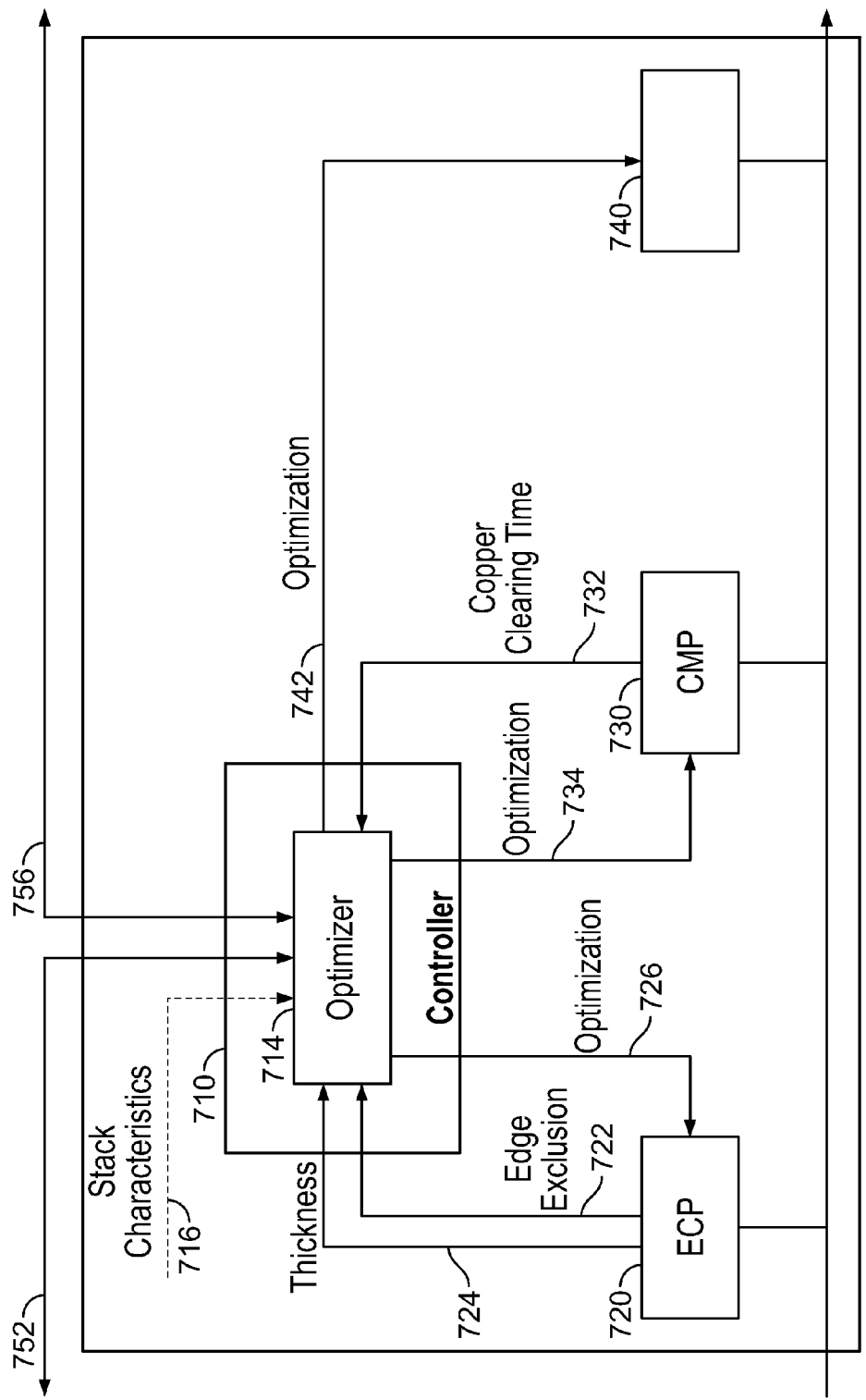
FIG. 7 depicts one example of a combined hardware and control process diagram of a copper wiring module illustrating one or more embodiments of the present invention.

Referring to FIG. 7, a combined hardware and control process diagram of a copper wiring module 704 illustrating one or more embodiments of the present invention is depicted. As mentioned above, module 704 may include any number of tools including, for example, an ECP tool 720, a CMP tool 730, and any other similar tools (e.g., barrier polishing tool 740). In a typical process, wafers are advanced into module 704 from upstream tools of upstream modules and, after processing by module 704, are forwarded to downstream tools of downstream modules. In the example of FIG. 7, wafers are initially processed by ECP tool 720, where a plating process takes place for applying a layer of copper onto the wafer substrate. From there, the wafer may be moved downstream to CMP tool 730, where the wafers are polished to remove any excess plating material. Afterwards, the wafers may be moved to the next tool in the module 740, which may include, for example, a barrier polishing or other similar tool. The end result or final product of the module includes the remaining copper material, which forms the desired copper geometric circuit pattern.

In accordance with one or more embodiments of the present invention, module 704 additionally includes a module level controller 710. As mentioned above, controller 710 controls operation of module 704. For example, controller 710 may be responsible for generating and/or optimizing the recipes of the individual tools of module 704. Specifically, implemented in controller 710 is an optimizer process 714 which may be embodied as, for example, a computer program stored in controller memory (not shown). In operation, optimizer 714 utilizes a number of inputs, such as, for example, metrology data to optimize processing of the tools of module 704. Similarly, optimizer 714 may receive input information from upstream and downstream modules and forward information to those modules as well. In addition to metrology information from the tools within the module, optimizer 714 may also receive information regarding the characteristics of the wafer as well. For example, optimizer 714 may receive characteristics of the dielectric stack formed on the substrate for use in optimizing processes at the individual tools 716.

Although optimizer 714 is depicted as being implemented in a module level controller (e.g., controller 710), it may just as easily be implemented in controllers located at other functional levels. For instance, embodiments of the present invention contemplate that an optimizer process for optimizing operations of a module may be implemented in controllers located at the fab level, the tool level, or other levels as well.

Referring back to FIG. 7, after (or during) processing at ECP tool 720, a number of metrology tools may be used to collect metrology data. This data may then be forwarded to optimizer 714. As discussed, examples of the data that may be forwarded include thickness data (724) and edge exclusion information (722). This information (after any necessary transformations [see, e.g., STEP 408 in FIG. 4]) may be processed by optimizer 714 to generate, for example, an optimized recipe for CMP tool 730. Subsequently, the optimized recipe is downloaded to CMP tool 730 for use in controlling CMP processing runs. For example, an extremely thick profile from ECP tool 720 may cause optimizer 714 to direct CMP tool 730 (via a CMP tool recipe) to spend more time on a bulk polishing step to remove greater amounts of material.

As with ECP tool 720, after (or during) processing at CMP tool 730, a number of metrology tools may be used to collect metrology data. This data may similarly be forwarded to optimizer 714. One example of data that may be forwarded includes copper clearing time information (732). This information may be processed by optimizer 714 to generate, for example, an optimized recipe for ECP tool 720 and/or any other tools (e.g., tool 740). Subsequently, the optimized recipe is downloaded to ECP tool 720 and tool 740 for use in controlling their processing runs (726 and 742).

In addition to feedback and feedforward information within module 704, information may also be transmitted from outside the module (e.g., from other modules). For example, optimizer 714 may receive from or transmit to upstream modules (752) and downstream modules (756) for optimizing module level processing. Similar techniques may also be implemented within an individual tool for optimizing processing at the chamber and other levels as well.

Figure 8:
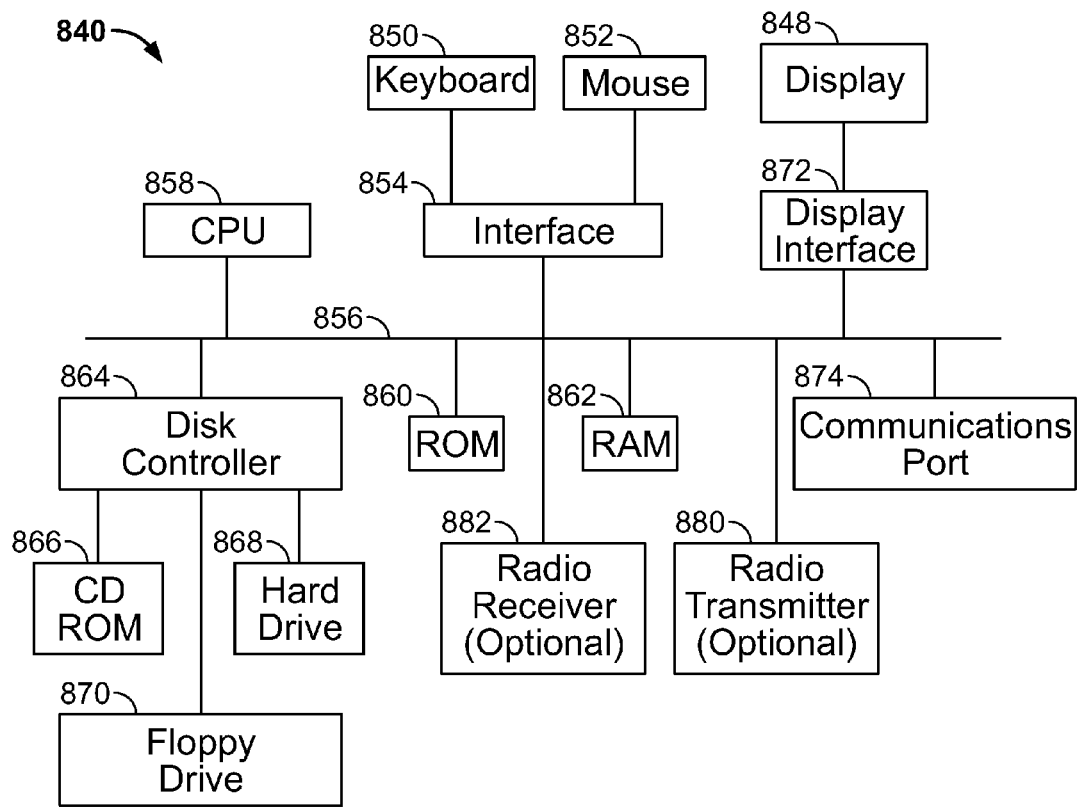
FIG. 8 is a high-level block diagram depicting aspects of computing devices contemplated as part of and for use with one or more embodiments of the present invention.

FIG. 8 illustrates a block diagram of one example of the internal hardware of any of the controllers utilized to implement the models discussed above, examples of which include any of a number of different types of computers such as those having Pentium™ based processors as manufactured by Intel Corporation of Santa Clara, Calif. A bus 856 serves as the main information link interconnecting the other components of the system. CPU 858 is the central processing unit of the system, performing calculations and logic operations required to execute the processes of the instant invention as well as other programs. Read only memory (ROM) 860 and random access memory (RAM) 862 constitute the main memory of the system. Disk controller 864 interfaces one or more disk drives to the system bus 856. These disk drives are, for example, floppy disk drives 870, or CD ROM or DVD (digital video disks) drives 866, or internal or external hard drives 868. CPU 858 can be any number of different types of processors, including those manufactured by Intel Corporation or Motorola of Schaumberg, Ill. The memory/storage devices can be any number of different types of memory devices such as DRAM and SRAM as well as various types of storage devices, including magnetic and optical media. Furthermore, the memory/storage devices can also take the form of a transmission.

A display interface 872 interfaces display 848 and permits information from the bus 856 to be displayed on display 848. Display 848 is also an optional accessory. Communications with external devices such as the other components of the system described above, occur utilizing, for example, communication port 874. For example, port 874 may be interfaced with a bus/network linked to a CMP tool. Optical fibers and/or electrical cables and/or conductors and/or optical communication (e.g., infrared, and the like) and/or wireless communication (e.g., radio frequency (RF), and the like) can be used as the transport medium between the external devices and communication port 874. Peripheral interface 854 interfaces the keyboard 850 and mouse 852, permitting input data to be transmitted to bus 856. In addition to these components, the control system also optionally includes an infrared transmitter 878 and/or infrared receiver 876. Infrared transmitters are optionally utilized when the computer system is used in conjunction with one or more of the processing components/stations that transmits/receives data via infrared signal transmission. Instead of utilizing an infrared transmitter or infrared receiver, the control system may also optionally use a low power radio transmitter 880 and/or a low power radio receiver 882. The low power radio transmitter transmits the signal for reception by components of the production process, and receives signals from the components via the low power radio receiver.

Figure 9:
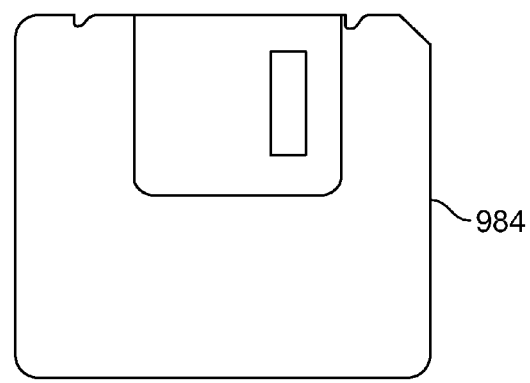
FIG. 9 illustrates one example of a memory medium which may be used for storing a computer implemented process of one or more embodiments of the present invention.

FIG. 9 is an illustration of an exemplary computer readable memory medium 984 utilizable for storing computer readable code or instructions including the model(s), recipe(s), etc). As one example, medium 984 may be used with disk drives illustrated in FIG. 8. Typically, memory media such as floppy disks, or a CD ROM, or a digital video disk will contain, for example, a multi-byte locale for a single byte language and the program information for controlling the above system to enable the computer to perform the functions described herein. Alternatively, ROM 860 and/or RAM 862 can also be used to store the program information that is used to instruct the central processing unit 858 to perform the operations associated with the instant processes. Other examples of suitable computer readable media for storing information include magnetic, electronic, or optical (including holographic) storage, some combination thereof, etc. In addition, one or more embodiments of the present invention contemplate that the computer readable medium can be a transmission.

Embodiments of the present invention contemplate that various portions of software for implementing the various aspects of the present invention as previously described can reside in the memory/storage devices.

In general, it should be emphasized that the various components of embodiments of the present invention can be implemented in hardware, software, or a combination thereof. In such embodiments, the various components and steps would be implemented in hardware and/or software to perform the functions of the present invention. Any presently available or future developed computer software language and/or hardware components can be employed in such embodiments of the present invention. For example, at least some of the functionality mentioned above could be implemented using C or C++ programming languages.

Further, it is to be understood that terms, such as "first" or "second," used in describing components, such as, for example, functional units and other components of the present invention herein (and in the claims), do not denote any form of order. Rather, such terms are used merely for convenience to differentiate between multiple and distinct components.

It is also to be appreciated and understood that the specific embodiments of the invention described hereinbefore are merely illustrative of the general principles of the invention. Various modifications may be made by those skilled in the art consistent with the principles set forth hereinbefore.

What is claimed is:

1. A computer-implemented method for processing wafers, the method comprising:
   subjecting a first wafer to a first deposition process and a subsequent polishing process, the first deposition process being controlled in accordance with a first deposition model that is operable to calculate parameters for the first deposition process, the polishing process being controlled in accordance with a polishing model that is operable to calculate parameters for the polishing process;
   measuring a property of the first wafer while or after the first wafer is subject to the polishing process, the measuring producing a measured value for the property of the first wafer;
   identifying a property of a subsequent wafer incoming to the first deposition process and calculating a pre-polish target value for the identified property, the identifying and calculating being based on the polishing model and the measured value of the property of the first wafer; and
   using the first deposition model to determine whether it is possible to achieve, by using the first deposition process, the pre-polish target value for the identified property and, if it is determined that it is possible to achieve the pre-polish target value, using the first deposition model to calculate parameters for the first deposition process that are needed to achieve the pre-polish target value.

2. The method of claim 1, wherein:
   the identifying and calculating is performed without consideration of the first model.

3. The method of claim 1, wherein:
   the first deposition model is a plating model and subjecting the first wafer to a first deposition process includes subjecting the wafer to a plating process.

4. The method of claim 3, wherein:
   a plating module, operable to use the plating model, controls the plating process and a polishing module, operable to use the polishing model, controls the polishing process, the method further comprising:
   sending a request from the polishing module to the plating module, the request specifying the target value and the identified property.

5. The method of claim 3, wherein:
   a module, operable to use the plating model and the polishing model, controls the plating process and the polishing process.

6. The method of claim 1, wherein:

identifying a property of the subsequent wafer includes identifying one or more of dielectric deposition thickness, dielectric deposition uniformity, critical depth, critical width, trench depth, sheet resistance, interconnect line resistance, thickness profile, sheet resistance profile, reflectance, resistivity drop, and reflectivity.

7. A computer-implemented method for processing wafers, the method comprising:

subjecting a first wafer to a first process and a subsequent polishing process, the first process being controlled in accordance with a first model that is operable to calculate parameters for the first process, the polishing process being controlled in accordance with a polishing model that is operable to calculate parameters for the polishing process;

measuring a property of the first wafer while or after the first wafer is subject to the polishing process, the measuring producing a measured value for the property of the first wafer;

identifying a property of a subsequent wafer incoming to the first process and calculating a pre-polish target value for the identified property, the identifying and calculating being based on the polishing model and the measured value of the property of the first wafer; and using the first model to determine whether it is possible to achieve, by using the first process, the pre-polish target value for the identified property and, if it is determined that it is possible to achieve the pre-polish target value, using the first model to calculate parameters for the first process that are needed to achieve the pre-polish target value, wherein:

the first process is an electro-chemical plating process that includes a bevel cleaning process; and calculating parameters for the first process includes calculating parameters for the bevel cleaning process.

8. The method of claim 1, wherein:

the first deposition model is an dielectric deposition model and subjecting the wafer to a first deposition process includes subjecting the wafer to a dielectric deposition process.

9. The method of claim 1, wherein the measured property is a first property, the method further comprising:

measuring a second property of the first wafer, the measuring being performed while the first wafer is being subject to the first deposition process or after the wafer has been subject to the first deposition process but before the wafer is subject to the polishing process; and using the polishing model and the second property to change parameters for the polishing process.

10. The method of claim 1, wherein the first deposition process includes multiple portions, the method further comprising:

identifying one or more portions of the first deposition process that can be adjusted to attain the pre-polish target value of the identified property.

11. The method of claim 1, wherein identifying a property and calculating a target value includes:

identifying a property and calculating pre-polish target value so that an efficiency of the polishing process is improved.

12. The method of claim 11, wherein improving efficiency includes achieving a particular range of interconnect line resistance.

13. The method of claim 11, wherein improving efficiency includes:

achieving a particular range of sheet resistance in a wafer after the wafer is subject to the first deposition process and the polishing process.

14. The method of claim 11, wherein improving efficiency includes:

optimizing efficiency.

15. The method of claim 1, further comprising:

receiving, from an in-line metrology station, a measurement indicating the pre-polish target property; and changing a recipe of the deposition process, the change being based on the measurement.

16. A computer program product, tangibly stored on machine readable medium, comprising instructions operable to cause a processor to operate a semiconductor wafer manufacturing system to:

subject a first wafer to a first deposition process and a subsequent polishing process, the first deposition process being controlled in accordance with a first deposition model that is operable to calculate parameters for the first deposition process, the polishing process being controlled in accordance with a polishing model that is operable to calculate parameters for the polishing process;

measure a property of the first wafer while or after the first wafer is subject to the polishing process, the measuring producing a measured value for the property of the first wafer;

identify a property of a subsequent wafer incoming to the first deposition process and calculate a pre-polish target value for the identified property, the identifying and calculating being based on the polishing model and the measured value of the property of the first wafer; and use the first deposition model to determine whether it is possible to achieve, by using the first deposition process, the pre-polish target value for the identified property and, if it is determined that it is possible to achieve the pre-polish target value, use the first deposition model to calculate parameters for the first deposition process that are needed to achieve the pre-polish target value.

17. The product of claim 16, wherein:

the identifying and calculating is performed without consideration of the first model.

18. The product of claim 16, wherein:

the first deposition model is a plating model and subjecting the first wafer to a first deposition process includes subjecting the wafer to a plating process.

19. The product of claim 18, wherein:

a plating module, operable to use the plating model, controls the plating process and a polishing module, operable to use the polishing model, controls the polishing process, the product further comprising instructions to:

send a request from the polishing module to the plating module, the request specifying the target value and the identified property.

20. The product of claim 18, wherein:

a module, operable to use the plating model and the polishing model, controls the plating process and the polishing process.

21. The product of claim 16, wherein:

identifying a property of the subsequent wafer includes identifying one or more of dielectric deposition thickness, dielectric deposition uniformity, critical depth, critical width, trench depth, sheet resistance, interconnect line resistance, thickness profile, sheet resistance profile, reflectance, resistivity drop, and reflectivity.

22. A computer program product tangibly stored on machine readable medium, comprising instructions operable to cause a processor to operate a semiconductor wafer manufacturing system to:
- subject a first wafer to a first process and a subsequent polishing process, the first process being controlled in accordance with a first model that is operable to calculate parameters for the first process, the polishing process being controlled in accordance with a polishing model that is operable to calculate parameters for the polishing process;
- measure a property of the first wafer while or after the first wafer is subject to the polishing process, the measuring producing a measured value for the property of the first wafer;
- identify a property of a subsequent wafer incoming to the first process and calculate a pre-polish target value for the identified property, the identifying and calculating being based on the polishing model and the measured value of the property of the first wafer; and
- use the first model to determine whether it is possible to achieve, by using the first process, the pre-polish target value for the identified property and, if it is determined that it is possible to achieve the pre-polish target value, use the first model to calculate parameters for the first process that are needed to achieve the pre-polish target value, wherein:
- the first process is an electro-chemical plating process that includes a bevel cleaning process; and
- calculating parameters for the first process includes calculating parameters for the bevel cleaning process.

23. The product of claim 16, wherein:
the first deposition model is an dielectric deposition model and subjecting the wafer to a first deposition process includes subjecting the wafer to a dielectric deposition process.

24. The product of claim 16, wherein the measured property is a first property, the product further comprising instructions to:
measure a second property of the first wafer, the measuring being performed while the first wafer is being subject to the first deposition process or after the wafer has been subject to the first deposition process but before the wafer is subject to the polishing process; and
use the polishing model and the second property to change parameters for the polishing process.

25. The product of claim 16, wherein the first deposition process includes multiple portions, the product further comprising instructions to:
identify one or more portions of the first deposition process that can be adjusted to attain the pre-polish target value of the identified property.

26. The product of claim 16, wherein identifying a property and calculating a target value includes:
identifying a property and calculating pre-polish target value so that an efficiency of the polishing process is improved.

27. The product of claim 26, wherein improving efficiency includes achieving a particular range of interconnect line resistance.

28. The product of claim 26, wherein improving efficiency includes:
achieving a particular range of sheet resistance in a wafer after the wafer is subject to the first deposition process and the polishing process.

29. The product of claim 26, wherein improving efficiency includes:
optimizing efficiency.

30. The product of claim 16, further comprising instructions to:
receive, from an in-line metrology station, a measurement indicating the pre-polish target property; and
change a recipe of the deposition process, the change being based on the measurement.

31. The method of claim 9, wherein:
using the polishing model and the second property to change parameters for the polishing process comprises changing parameters to obtain a desired output property on the wafer.

32. The product of claim 24, wherein:
instructions to use of the polishing model and the second property to change parameters for the polishing process comprises instructions to change parameters to obtain a desired output property on the wafer.

* * * * *